(12) United States Patent  (10) Patent No.: US 8,154,116 B2
Sasaki et al.  (45) Date of Patent: Apr. 10, 2012

(54) LAYERED CHIP PACKAGE WITH HEAT SINK

(75) Inventors: Yoshitaka Sasaki, Milpitas, CA (US); Hiroyuki Ito, Milpitas, CA (US); Tatsuya Harada, Tokyo (JP); Nobuyuki Okuzawa, Tokyo (JP); Satoru Sueki, Tokyo (JP); Hiroshi Ikejima, Hong Kong (CN)

(73) Assignees: HeadwayTechnologies, Inc., Milpitas, CA (US); TDK Corporation, Tokyo (JP); SAE Magnetics (H.K.) Ltd., Hong Kong (CN)

( * ) Notice: Subject to any disclaimer, the term of this patent is extended or adjusted under 35 U.S.C. 154(b) by 407 days.

(21) Appl. No.: 12/289,745

(22) Filed: Nov. 3, 2008

(65) Prior Publication Data

US 2010/0109137 A1 May 6, 2010

(51) Int. Cl.
*H01L 23/34* (2006.01)
*H01L 23/02* (2006.01)

(52) U.S. Cl. ............ 257/713; 257/686; 257/707

(58) Field of Classification Search .......... 257/686, 257/706, 707, 713, E23.101, E23.102, 714, 257/414
See application file for complete search history.

(56) References Cited

U.S. PATENT DOCUMENTS

| 4,868,712 A * | 9/1989 | Woodman ............... 361/689 |
| 5,883,426 A | 3/1999 | Tokuno et al. |
| 5,953,588 A | 9/1999 | Camien et al. |
| 7,127,807 B2 | 10/2006 | Yamaguchi et al. |
| 7,369,410 B2 * | 5/2008 | Chen et al. ............... 361/701 |
| 7,429,792 B2 * | 9/2008 | Lee et al. ............... 257/712 |
| 2008/0042261 A1 * | 2/2008 | Wolter et al. ............... 257/706 |

FOREIGN PATENT DOCUMENTS

| JP | A-6-045705 | 2/1994 |
| JP | A-2000-252419 | 9/2000 |

OTHER PUBLICATIONS

Keith D. Gann, "Neo-Stacking Technology", HDI Magazine, Dec. 1999.
Sasaki et al., U.S. Appl. No. 12/216,144, Jun. 30, 2008.
Sasaki et al., U.S. Appl. No. 12/285,101, Sep. 29, 2008.

* cited by examiner

*Primary Examiner* — Hung Vu
(74) *Attorney, Agent, or Firm* — Oliff & Berridge, PLC

(57) ABSTRACT

A layered chip package includes: a plurality of layer portions stacked, each of the layer portions including a semiconductor chip; and a heat sink. Each of the plurality of layer portions has a top surface, a bottom surface, and four side surfaces. The heat sink has at least one first portion, and a second portion coupled to the at least one first portion. The at least one first portion is adjacent to the top surface or the bottom surface of at least one of the layer portions. The second portion is adjacent to one of the side surfaces of each of at least two of the plurality of layer portions.

18 Claims, 30 Drawing Sheets

LAYERED CHIP PACKAGE WITH HEAT SINK

BACKGROUND OF THE INVENTION

1. Field of the Invention

The present invention relates to a layered chip package that includes a plurality of chips stacked and a heat sink.

2. Description of the Related Art

In recent years, a reduction in weight and an improvement in performance have been demanded of mobile devices typified by cellular phones and notebook personal computers. Accordingly, there has been a demand for higher integration of electronic components for use in mobile devices. Higher integration of electronic components has been demanded also for achieving an increase in capacity of semiconductor memory.

As an example of highly integrated electronic components, a system-in-package (hereinafter referred to as SiP), especially an SiP utilizing a three-dimensional packaging technology for stacking a plurality of chips, has attracting attention in recent years. In the present application, a package including a plurality of chips stacked is called a layered chip package. Since the layered chip package allows a reduction in wiring length, it provides the advantage of allowing a higher operation speed for a circuit and a reduction in stray capacitance of wiring, as well as the advantage of allowing higher integration.

Major examples of three-dimensional packaging technology for fabricating a layered chip package include a wire bonding method and a through electrode method. According to the wire bonding method, a plurality of chips are stacked on a substrate and a plurality of electrodes formed on each chip are connected, by wire bonding, to external connecting terminals formed on the substrate. According to the through electrode method, a plurality of through electrodes are formed in each of chips to be stacked and inter-chip wiring is performed through the use of the through electrodes.

The wire bonding method has a problem that it is difficult to reduce the distance between the electrodes so as to avoid contact between wires, and a problem that high resistances of the wires hamper a high-speed operation of a circuit.

The through electrode method is free from the above-mentioned problems of the wire bonding method. Unfortunately, however, the through electrode method requires a large number of steps for forming the through electrodes in chips, and consequently increases the cost for the layered chip package. According to the through electrode method, forming the through electrodes in chips requires a series of steps as follows: forming a plurality of holes for the plurality of through electrodes in a wafer that will be cut later to become a plurality of chips; forming an insulating layer and a seed layer in the plurality of holes and on the top surface of the wafer; forming a plurality of through electrodes by filling the plurality of holes with metal such as Cu by plating; and removing unwanted portions of the seed layer.

According to the through electrode method, the through electrodes are formed by filling metal into holes having relatively high aspect ratios. Consequently, voids or keyholes are prone to occur in the through electrodes due to poor filling of the holes with metal, so that the reliability of wiring using the through electrodes tends to be reduced.

According to the through electrode method, an upper chip and a lower chip are physically joined to each other by connecting the through electrodes of the upper and lower chips by means of, for example, soldering. The through electrode method therefore requires that the upper and lower chips be accurately aligned and then joined to each other at high temperatures. When the upper and lower chips are joined to each other at high temperatures, however, misalignment between the upper and lower chips can occur due to expansion and contraction of the chips, which often results in electrical connection failure between the upper and lower chips.

U.S. Pat. No. 5,953,588 discloses a method of manufacturing a layered chip package as described below. In this method, a plurality of chips cut out from a processed wafer are embedded into an embedding resin and then a plurality of leads are formed to be connected to each chip, whereby a structure called a neo-wafer is fabricated. Next, the neo-wafer is diced to form a plurality of structures each called a neo-chip. Each neo-chip includes: one or more chips; resin surrounding the chip(s); and a plurality of leads. The plurality of leads connected to each chip each have an end face exposed at a side surface of the neo-chip. Next, a plurality of kinds of neo-chips are laminated into a stack. In the stack, the respective end faces of the plurality of leads connected to the chips of each layer are exposed at the same side surface of the stack.

Keith D. Gann, "Neo-Stacking Technology", HDI Magazine, December 1999, discloses fabricating a stack by the same method as U.S. Pat. No. 5,953,588, and forming wiring on two side surfaces of the stack.

The manufacturing method disclosed in U.S. Pat. No. 5,953,588 involves a number of process steps and this raises the cost for the layered chip package. According to this method, after the plurality of chips cut out from the processed wafer are embedded into the embedding resin, the plurality of leads are formed to be connected to each chip to thereby fabricate the neo-wafer, as described above. Accurate alignment of the plurality of chips is therefore required when fabricating the neo-wafer. This is also a factor that raises the cost for the layered chip package.

U.S. Pat. No. 7,127,807 B2 discloses a multilayer module formed by stacking a plurality of active layers each including a flexible polymer substrate with at least one electronic element and a plurality of electrically-conductive traces formed within the substrate. According to this multilayer module, however, it is impossible to increase the proportion of the area occupied by the electronic element in each active layer, and consequently it is difficult to achieve higher integration.

If a layered chip package includes a chip that generates a large amount of heat during operation (hereinafter referred to as a heat generating chip), such as a microprocessor, the following problems arise. First, the heat generated by the heat generating chip can adversely affect the operation not only of the heat generating chip but also of other chips in the layered chip package. Second, if vertically adjacent chips in the layered chip package are bonded to each other with an adhesive, the heat generated by the heat generating chip can melt the adhesive, causing failures of bonding and electrical connection between the chips to thereby deteriorate reliability. A layered chip package including a heat generating chip therefore requires that the heat generated by the heat generating chip be dissipated.

U.S. Pat. No. 5,883,426 discloses a stack module that includes a plurality of substrates stacked, each substrate having a semiconductor chip mounted thereon, with a wave-shaped heat-dissipating member or heat pipe provided between the semiconductor chip and the substrate adjacent thereto. Published Unexamined Japanese Patent Application No. 2000-252419 discloses a three-dimensional module that includes a plurality of devices (semiconductor packages) stacked on a substrate, with heat sinks provided between the substrate and a device and between every vertically adjacent two devices, respectively.

A layered chip package including a heat generating chip may also be provided with heat sinks between every vertically adjacent chips, like the modules disclosed in U.S. Pat. No. 5,883,426 and Published Unexamined Japanese Patent Application No. 2000-252419. In this case, however, it is necessary that the heat sinks be extended horizontally in order to obtain a sufficient heat dissipation effect. This gives rise to the problem that the layered chip package including the heat sinks increases in size. Besides, in a layered chip package wherein inter-chip wiring is established by the through electrode method, it is impossible to provide heat sinks between every vertically adjacent chips.

OBJECT AND SUMMARY OF THE INVENTION

An object of the present invention is to provide a layered chip package that includes a plurality of chips stacked and a heat sink, the layered chip package being capable of increasing the heat dissipation effect of the heat sink without an increase in size.

A first layered chip package of the present invention includes: a plurality of layer portions stacked, each of the layer portions including a semiconductor chip; and a heat sink. Each of the plurality of layer portions has a top surface, a bottom surface, and four side surfaces. The heat sink has at least one first portion, and a second portion coupled to the at least one first portion. The at least one first portion is adjacent to the top surface or the bottom surface of at least one of the layer portions. The second portion is adjacent to one of the side surfaces of each of at least two of the plurality of layer portions.

As employed in the present invention, the term "stacked" applied to a plurality of layer portions shall cover the case where the plurality of layer portions are stacked so that the first portion of the heat sink is interposed between vertically adjacent two of the layer portions.

The first layered chip package of the present invention may further include a layer stack including two or more of the layer portions that are integrated. In this case, each of the two or more layer portions included in the layer stack may further include a plurality of electrodes, each of the electrodes being connected to the semiconductor chip and having an end face located in at least one of the four side surfaces of the layer portion to which the second portion of the heat sink is not adjacent. The layered chip package may further include wiring connected to the end faces of the plurality of electrodes of the two or more layer portions included in the layer stack. The semiconductor chip may have a top surface, a bottom surface, and four side surfaces. Each of the two or more layer portions included in the layer stack may further include an insulating portion covering at least one of the four side surfaces of the semiconductor chip. The insulating portion may have at least one end face located in at least one of the four side surfaces of the layer portion to which the second portion of the heat sink is not adjacent. The end face of each of the plurality of electrodes may be surrounded by the insulating portion.

In the first layered chip package of the present invention, the heat sink may have two first portions located at a distance from each other, and a specific one of the plurality of layer portions may be interposed between the two first portions. In this case, each of the plurality of layer portions may further include a plurality of electrodes, each of the electrodes being connected to the semiconductor chip and having an end face located in at least one of the four side surfaces of the layer portion to which the second portion of the heat sink is not adjacent. The layered chip package may further include wiring connected to the end faces of the plurality of electrodes of the plurality of layer portions. The semiconductor chip may have a top surface, a bottom surface, and four side surfaces. Each of the plurality of layer portions may further include an insulating portion covering at least one of the four side surfaces of the semiconductor chip. The insulating portion may have at least one end face located in at least one of the four side surfaces of the layer portion to which the second portion of the heat sink is not adjacent. The end face of each of the plurality of electrodes may be surrounded by the insulating portion. One of the two first portions of the heat sink may be located between the specific one of the layer portions and a different one of the layer portions. The layered chip package may further include an insulating film disposed between the wiring and the one of the first portions that is located between the specific one of the layer portions and the different one of the layer portions.

In the first layered chip package of the present invention, the heat sink may have a hollow main body, and a refrigerant contained in the main body.

A second layered chip package of the present invention includes: a plurality of layer portions stacked, each of the layer portions including a semiconductor chip; and a first heat sink and a second heat sink. Each of the plurality of layer portions has a top surface, a bottom surface, and four side surfaces. Each of the first and second heat sinks has a first portion and a second portion coupled to each other. A specific one of the plurality of layer portions is interposed between the first portion of the first heat sink and the first portion of the second heat sink. At least one of the second portion of the first heat sink and the second portion of the second heat sink is adjacent to one of the side surfaces of each of at least two of the plurality of layer portions.

The second layered chip package of the present invention may further include a layer stack including two or more of the layer portions that are integrated. The layer stack has a top surface, a bottom surface, and a first to a fourth side surface. In this case, the first portion of the first heat sink may be adjacent to the top surface of the specific one of the layer portions, the second portion of the first heat sink may be adjacent to the first side surface of the layer stack, the first portion of the second heat sink may be adjacent to the bottom surface of the specific one of the layer portions, and the second portion of the second heat sink may be adjacent to one of the side surfaces of the specific one of the layer portions and to the second side surface of the layer stack. In this case, each of the two or more layer portions included in the layer stack may further include a plurality of electrodes, each of the electrodes being connected to the semiconductor chip and having an end face located in at least one of the four side surfaces of the layer portion to which neither the second portion of the first heat sink nor the second portion of the second heat sink is adjacent. The second layered chip package may further include wiring connected to the end faces of the plurality of electrodes of the two or more layer portions included in the layer stack.

In the second layered chip package of the foregoing configuration, the semiconductor chip may have a top surface, a bottom surface and four side surfaces, and each of the two or more layer portions included in the layer stack may further include an insulating portion covering at least one of the four side surfaces of the semiconductor chip. The insulating portion may have at least one end face located in at least one of the four side surfaces of the layer portion to which neither the second portion of the first heat sink nor the second portion of the second heat sink is adjacent. The end face of each of the plurality of electrodes may be surrounded by the insulating portion.

In the second layered chip package of the present invention, each of the plurality of layer portions may further include a plurality of electrodes, each of the electrodes being connected to the semiconductor chip and having an end face located in at least one of the four side surfaces of the layer portion to which neither the second portion of the first heat sink nor the second portion of the second heat sink is adjacent. The layered chip package may further include wiring connected to the end faces of the plurality of electrodes of the plurality of layer portions.

In the second layered chip package of the foregoing configuration, the semiconductor chip may have a top surface, a bottom surface and four side surfaces, and each of the plurality of layer portions may further include an insulating portion covering at least one of the four side surfaces of the semiconductor chip. The insulating portion may have at least one end face located in at least one of the four side surfaces of the layer portion to which neither the second portion of the first heat sink nor the second portion of the second heat sink is adjacent. The end face of each of the plurality of electrodes may be surrounded by the insulating portion. The first portion of the first heat sink or the first portion of the second heat sink may be located between the specific one of the layer portions and a different one of the layer portions, and the layered chip package may further include an insulating film for insulation between the wiring and the first portion located between the specific one of the layer portions and the different one of the layer portions.

The second layered chip package of the present invention may further include a plurality of bonding wires for establishing electrical connection between the specific one of the layer portions and other one or more of the layer portions.

In the second layered chip package of the present invention, each of the first and second heat sinks may have a hollow main body, and a refrigerant contained in the main body.

According to the first or second layered chip package of the present invention, the second portion of the heat sink is adjacent to the side surface of each of at least two of the layer portions. This serves to improve the heat dissipation effect of the layered chip package without increasing the layered chip package in size.

Other and further objects, features and advantages of the invention will appear more fully from the following description.

DETAILED DESCRIPTION OF THE PREFERRED EMBODIMENTS

First Embodiment

Figure 1:
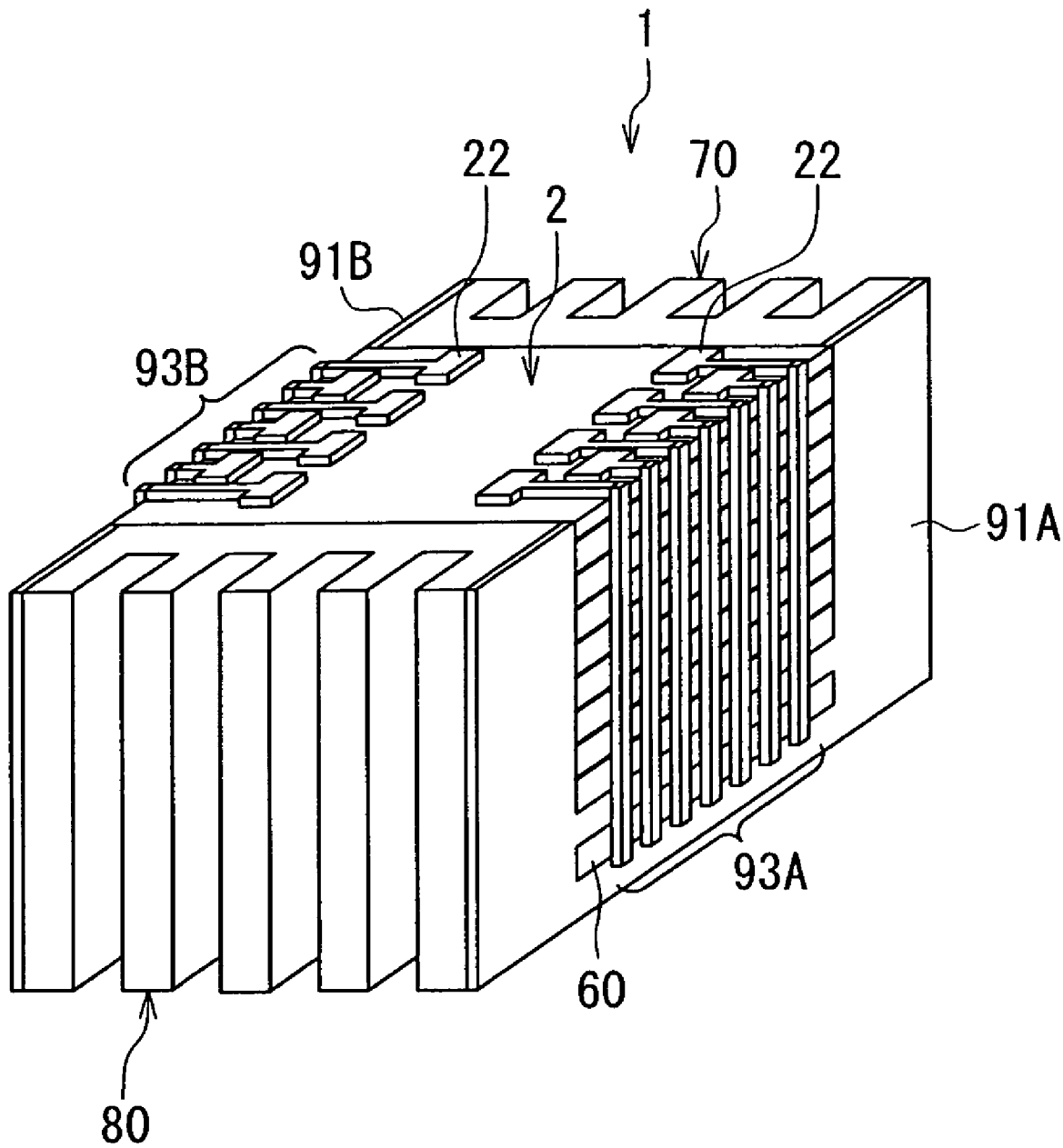
FIG. 1 is a perspective view of a layered chip package according to a first embodiment of the invention.

Embodiments of the present invention will now be described in detail with reference to the drawings. Reference is first made to FIG. 1 to describe the overall configuration of a layered chip package 1 according to a first embodiment of the present invention. FIG. 1 is a perspective view of the layered chip package 1 according to the present embodiment. The layered chip package 1 according to the present embodiment includes a layer stack 2, a specific layer portion 60, a first heat sink 70, and a second heat sink 80. The layer stack 2 includes two or more layer portions that are stacked and integrated. Each of the two or more layer portions included in the layer stack 2 and the layer portion 60 includes a semiconductor chip. The layered chip package 1 further includes insulating films 91A and 91B and wiring 93A and 93B.

Figure 2:
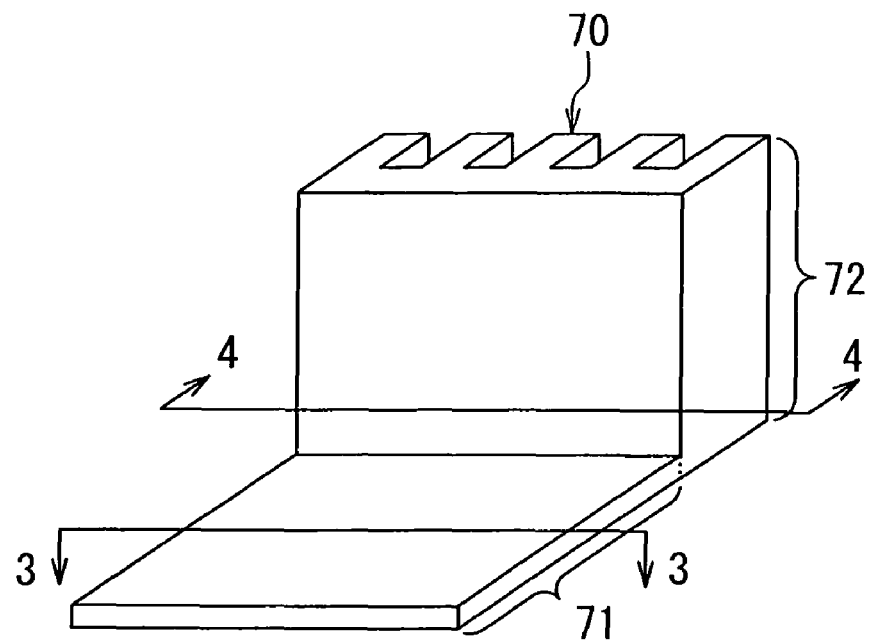
FIG. 2 is a perspective view of a first heat sink of the layered chip package shown in FIG. 1.
Figure 3:
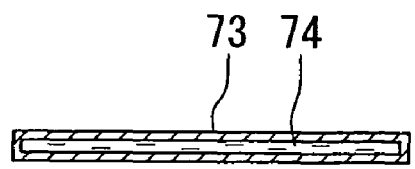
FIG. 3 is a cross-sectional view of the first heat sink taken along line 3-3 of FIG. 2.
Figure 4:
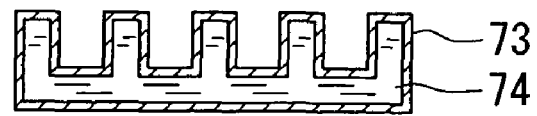
FIG. 4 is a cross-sectional view of the first heat sink taken along line 4-4 of FIG. 2.

FIG. 2 is a perspective view of the first heat sink 70. FIG. 3 is a cross-sectional view of the first heat sink 70 taken along line 3-3 of FIG. 2. FIG. 4 is a cross-sectional view of the first heat sink 70 taken along line 4-4 of FIG. 2. The first heat sink 70 has a first portion 71 and a second portion 72 coupled to each other. In appearance, the first portion 71 has a plate-like configuration with a rectangular planar shape. The second portion 72 is coupled to the first portion 71 at one side of the first portion 71, and extends upward perpendicularly to the first portion 71. Hereinafter, the direction in which the second portion 72 extends will be referred to as the vertical direction. The second portion 72 is shaped like a fin.

As shown in FIG. 3 and FIG. 4, the first heat sink 70 has a hollow main body 73 and a refrigerant 74 contained in the main body 73. The main body 73 is formed of metal, for example. The hollow of the second portion 72 communicates with the hollow of the first portion 71. The refrigerant 74 fills the entire hollow of the first portion 71. It also fills the hollow of the second portion 72 up to an intermediate position of the second portion 72 from the bottom in the vertical direction. The refrigerant 74 is a volatile liquid. Examples of the refrigerant 74 include ethylene glycol-based refrigerants, Freon, and Freon substitutes.

Figure 5:
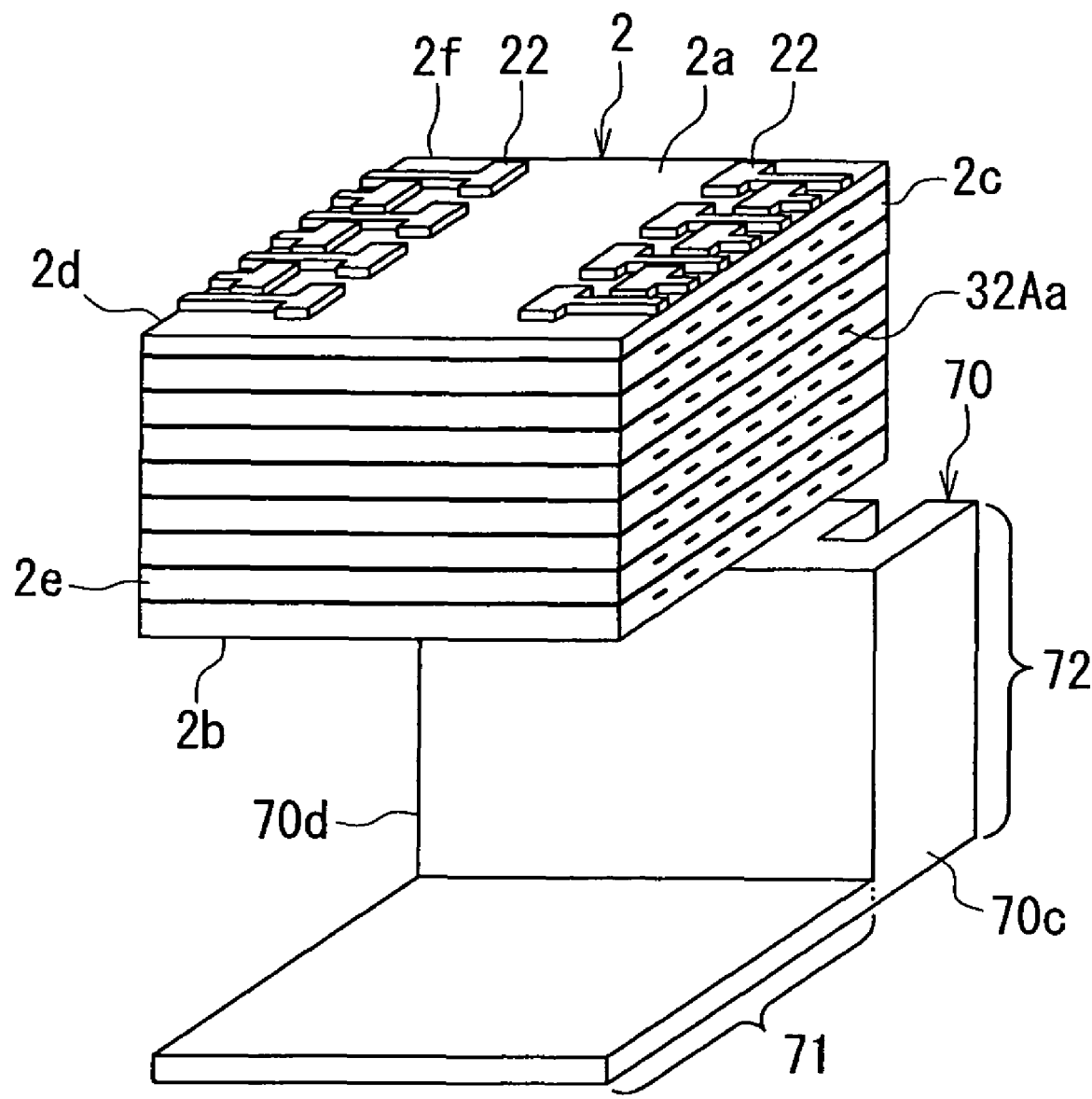
FIG. 5 is a perspective view showing the first heat sink and a layer stack of the layered chip package of FIG. 1 in a separated state.

FIG. 5 is a perspective view showing the first heat sink 70 and the layer stack 2 in a separated state. The layer stack 2 has a top surface 2a, a bottom surface 2b, two side surfaces 2c and 2d facing toward opposite directions, and two side surfaces 2e and 2f facing toward opposite directions. Each of the two or more layer portions included in the layer stack 2 is rectangular-solid-shaped, having a top surface, a bottom surface and four side surfaces. The layer stack 2 has a plurality of pad-shaped terminals 22 disposed on the top surface 2a. The plurality of pad-shaped terminals 22 function as external connecting terminals of the layered chip package 1. Some of the plurality of pad-shaped terminals 22 each have an end face located in the side surface 2c, and some others of the plurality of pad-shaped terminals 22 each have an end face located in the side surface 2d. The layer stack 2 excluding the plurality of pad-shaped terminals 22 is rectangular-solid-shaped.

The layer stack 2 and the first heat sink 70 are arranged so that the first portion 71 of the first heat sink 70 is adjacent to the bottom surface 2b of the layer stack 2 while the second portion 72 of the first heat sink 70 is adjacent to the side surface 2f of the layer stack 2. The layer stack 2 and the first heat sink 70 are bonded to each other by such means as an insulating adhesive. The layer stack 2 and the first heat sink 70 are insulated from each other by, for example, this insulating adhesive. With the layer stack 2 and the first heat sink 70 bonded together, the upper end of the second portion 72 of the first heat sink 70 lies at the same height as or above the top surface 2a of the layer stack 2. End faces of a plurality of electrodes are located in two of the side surfaces of each layer portion, the two of the side surfaces being located in the side surfaces 2c and 2d of the layer stack 2, respectively. FIG. 5 only shows the end faces 32Aa of the plurality of electrodes located in one of the side surfaces of each layer portion, the one of the side surfaces being located in the side surface 2c of the layer stack 2. The dimension of the layer stack 2 taken in the direction orthogonal to the side surfaces 2c and 2d is slightly greater than the dimension of the first heat sink 70 taken in that direction. With the layer stack 2 and the first heat sink 70 bonded together, the side surfaces 2c and 2d slightly protrude from the corresponding side surfaces 70c and 70d of the first heat sink 70.

Figure 6:
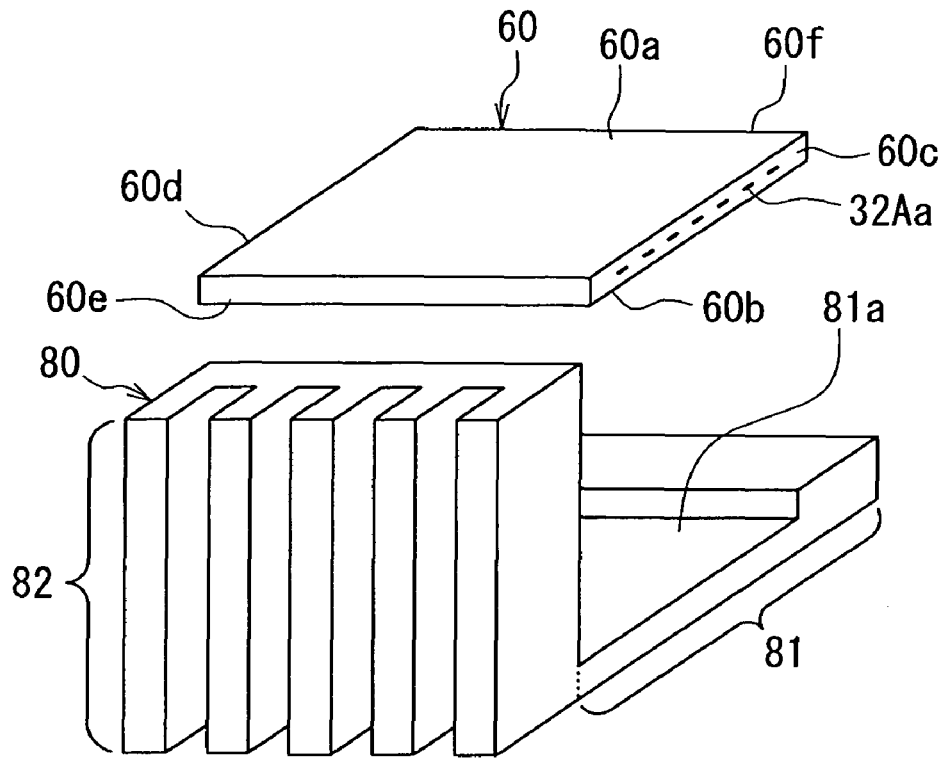
FIG. 6 is a perspective view showing a second heat sink and a specific layer portion of the layered chip package of FIG. 1 in a separated state.
Figure 7:
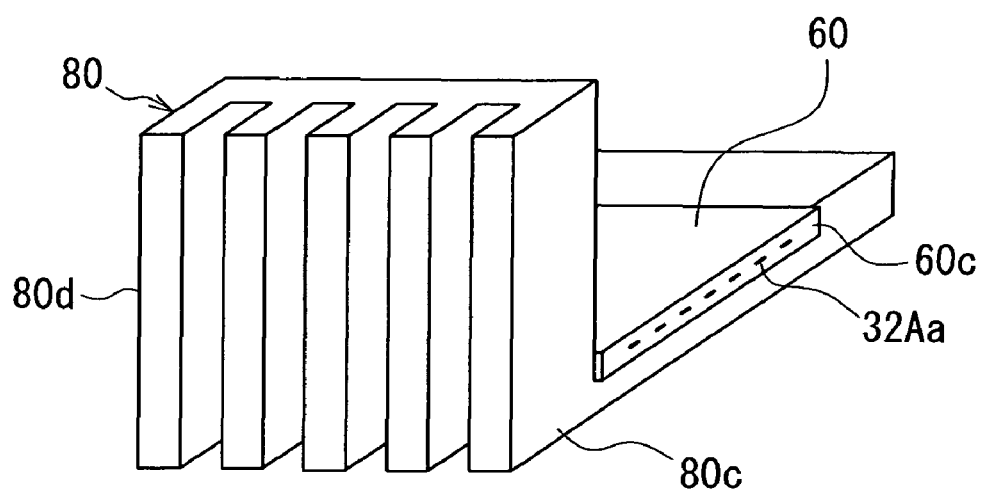
FIG. 7 is a perspective view showing the second heat sink and the specific layer portion of the layered chip package of FIG. 1 in a bonded state.

FIG. 6 is a perspective view showing the second heat sink 80 and the layer portion 60 in a separated state. FIG. 7 is a perspective view showing the second heat sink 80 and the layer portion 60 in a bonded state. The layer portion 60 is rectangular-solid-shaped and has a top surface 60a, a bottom surface 60b, two side surfaces 60c and 60d facing toward opposite directions, and two side surfaces 60e and 60f facing toward opposite directions. End faces of a plurality of electrodes are located in each of the side surfaces 60c and 60d. FIG. 6 only shows the end faces 32Aa of the plurality of electrodes located in the side surface 60c.

The second heat sink 80 has a first portion 81 and a second portion 82 coupled to each other. In appearance, the first portion 81 has a plate-like configuration with a rectangular planar shape. A recess 81a is formed in the top surface of the first portion 81. The layer portion 60 is accommodated in this recess 81a. The layer portion 60 is bonded to the second heat sink 80 by such means as an insulating adhesive. In this state, the top surface 60a of the layer portion 60 is flush with the top surface of the first portion 81 excluding the recess 81a. The layer portion 60 and the second heat sink 80 are insulated from each other by, for example, the aforementioned insulating adhesive.

The second portion 82 is coupled to the first portion 81 at one side of the first portion 81, and extends upward perpendicularly to the first portion 81. The second portion 82 is shaped like a fin. The side surface 60e of the layer portion 60 is adjacent to the second portion 82. The dimension of the layer portion 60 taken in the direction orthogonal to the side surfaces 60c and 60d of the layer portion 60 is slightly greater than the dimension of the second heat sink 80 taken in that direction. With the layer portion 60 and the second heat sink 80 bonded together, the side surfaces 60c and 60d slightly protrude from the corresponding side surfaces 80c and 80d of the second heat sink 80.

Although not shown in the drawings, the second heat sink 80 also has a hollow main body and a refrigerant contained in the main body, as does the first heat sink 70. The main body is formed of metal, for example. The hollow of the second portion 82 communicates with the hollow of the first portion 81. The refrigerant fills the entire hollow of the first portion 81. It also fills the hollow of the second portion 82 up to an intermediate position of the second portion 82 from the bottom in the vertical direction.

The heat sinks 70 and 80 cool the layer stack 2 and the layer portion 60 through evaporation of the refrigerants inside the heat sinks due to heat generated by the layer stack 2 and the layer portion 60. The latent heat of the evaporated refrigerants is released to the outside from the fin-shaped second portions 72 and 82, whereby the evaporated refrigerants are cooled back into liquid. To promote the heat dissipation at the second portions 72 and 82, the second portions 72 and 82 may be air-cooled by using a fan.

The insulating film 91A covers the side surfaces 70c and 80c of the heat sinks 70 and 80 located around the side surface 2c of the layer stack 2 and the side surface 60c of the layer portion 60. The insulating film 91B covers the side surfaces 70d and 80d of the heat sinks 70 and 80 located around the side surface 2d of the layer stack 2 and the side surface 60d of the layer portion 60.

The wiring 93A is connected to: the end faces of the plurality of pad-shaped terminals 22 located in the side surface 2c of the layer stack 2; the end faces 32Aa of the plurality of electrodes located in one of the side surfaces of each of the layer portions, the one of the side surfaces being located in the side surface 2c of the layer stack 2; and the end faces 32Aa of the plurality of electrodes located in the side surface 60c of the layer portion 60. The wiring 93A is laid astride an area of the side surface 70c of the heat sink 70, the area corresponding to the first portion 71. The insulating film 91A covering the side surface 70c of the heat sink 70 insulates the first portion 71 of the heat sink 70 and the wiring 93A from each other.

The wiring 93B is connected to: the end faces of the plurality of pad-shaped terminals 22 located in the side surface 2d of the layer stack 2; the end faces of the plurality of electrodes located in one of the side surfaces of each of the layer portions, the one of the side surfaces being located in the side surface 2d of the layer stack 2; and the end faces of the plurality of electrodes located in the side surface 60d of the layer portion 60. The wiring 93B is laid astride an area of the side surface 70d of the heat sink 70, the area corresponding to the first portion 71. The insulating film 91B covering the side surface 70d of the heat sink 70 insulates the first portion 71 of the heat sink 70 and the wiring 93B from each other.

Figure 8:
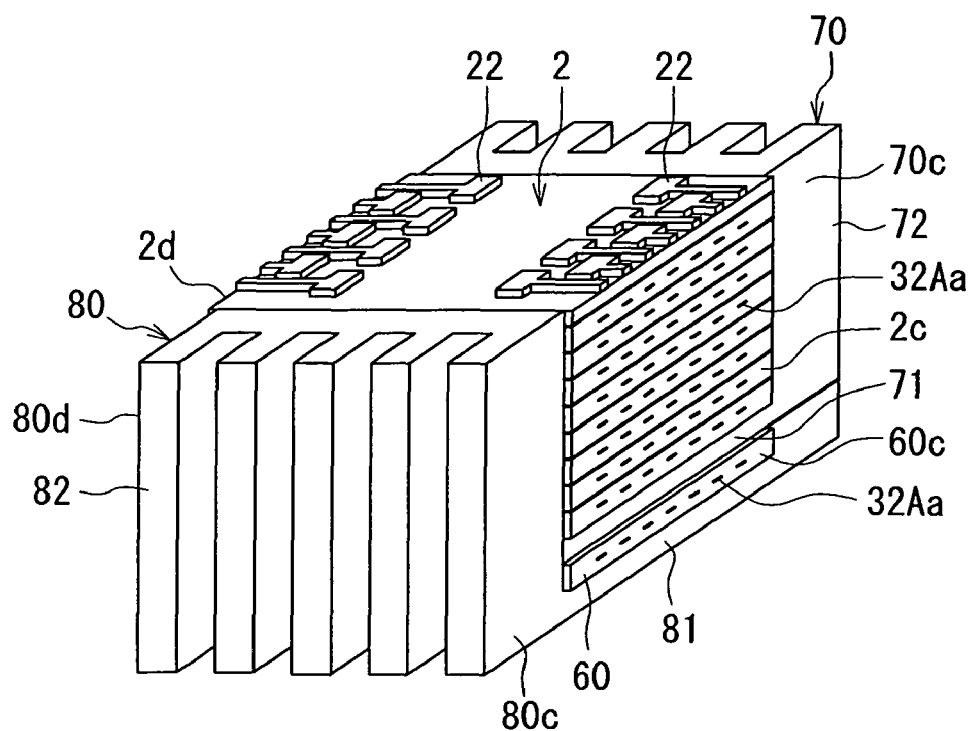
FIG. 8 is a perspective view showing a step of a method of manufacturing the layered chip package shown in FIG. 1.
Figure 9:
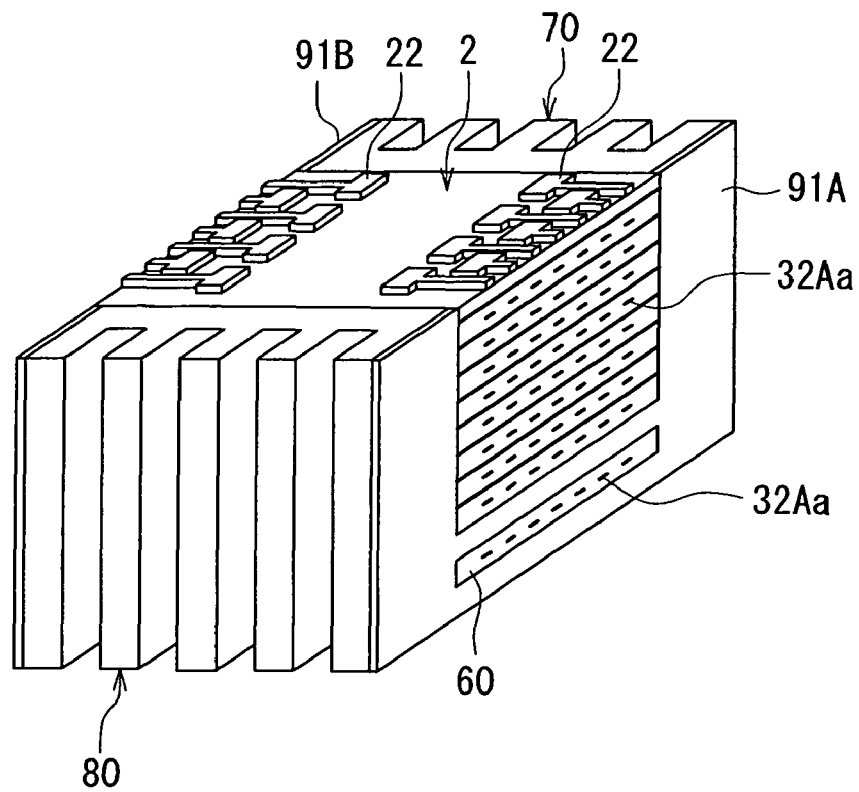
FIG. 9 is a perspective view showing a step that follows the step of FIG. 8.

A method of manufacturing the layered chip package 1 shown in FIG. 1 will now be described with reference to FIG. 8 and FIG. 9. FIG. 8 is a perspective view showing a step of the method of manufacturing the layered chip package 1. FIG. 9 is a perspective view showing a step that follows the step of FIG. 8. In the method of manufacturing the layered chip package 1, first, the layer stack 2 and the first heat sink 70 are bonded to each other into a first combination, while the layer portion 60 and the second heat sink 80 are bonded to each other into a second combination. Next, as shown in FIG. 8, the first combination and the second combination are bonded to each other by such means as an adhesive such that the first portion 71 of the first heat sink 70 is placed on the layer portion 60 while the second portion 82 of the second heat sink 80 is adjacent to the side surface 2e of the layer stack 2. In this state, the side surface 2c of the layer stack 2 and the side surface 60c of the layer portion 60 slightly protrude from the side surfaces 70c and 80c of the heat sinks 70 and 80. Similarly, the side surface 2d of the layer stack 2 and the side surface 60d of the layer portion 60 slightly protrude from the side surfaces 70d and 80d of the heat sinks 70 and 80.

Next, a resin film to later become the insulating film 91A is formed to cover the side surface 2c of the layer stack 2, the side surface 60c of the layer portion 60, and the side surfaces 70c and 80c of the heat sinks 70 and 80. Similarly, a resin film to later become the insulating film 91B is formed to cover the side surface 2d of the layer stack 2, the side surface 60d of the layer portion 60, and the side surfaces 70d and 80d of the heat sinks 70 and 80.

Next, as shown in FIG. 9, the resin film that covers the side surfaces 70c and 80c of the heat sinks 70 and 80 is polished until the side surface 2c of the layer stack 2 and the side surface 60c of the layer portion 60 become exposed. The remaining part of the resin film serves as the insulating film 91A. Similarly, the resin film that covers the side surfaces 70d and 80d of the heat sinks 70 and 80 is polished until the side surface 2d of the layer stack 2 and the side surface 60d of the layer portion 60 become exposed. The remaining part of the resin film serves as the insulating film 91B.

Next, as shown in FIG. 1, the wiring 93A is formed to be connected to: the end faces of the plurality of pad-shaped terminals 22 located in the side surface 2c of the layer stack 2; the end faces 32Aa of the plurality of electrodes located in one of the side surfaces of each of the layer portions, the one of the side surfaces being located in the side surface 2c of the layer stack 2; and the end faces 32Aa of the plurality of electrodes located in the side surface 60c of the layer portion 60. Similarly, the wiring 93B is formed to be connected to: the end faces of the plurality of pad-shaped terminals 22 located in the side surface 2d of the layer stack 2; the end faces of the plurality of electrodes located in one of the side surfaces of each of the layer portions, the one of the side surfaces being located in the side surface 2d of the layer stack 2; and the end faces of the plurality of electrodes located in the side surface 60d of the layer portion 60.

The wiring 93A, 93B is formed by frame plating, for example. In this case, first, a seed layer for plating is formed over the surface where to form the wiring 93A. Next, a frame having grooves is formed on the seed layer. The frame is formed by patterning a photoresist film by photolithography, for example. Next, plating layers to become part of the wiring 93A is formed by plating on the seed layer in the grooves of the frame. Next, the frame is removed and the seed layer except portions thereof located below the plating layers is also removed by etching. As a result, the wiring 93A is formed of the plating layers and the portions of the seed layer remaining therebelow. Next, the wiring 93B is formed by the same forming method as the wiring 93A over the surface where to form the wiring 93B. The layered chip package 1 shown in FIG. 1 is thereby completed.

Figure 10:
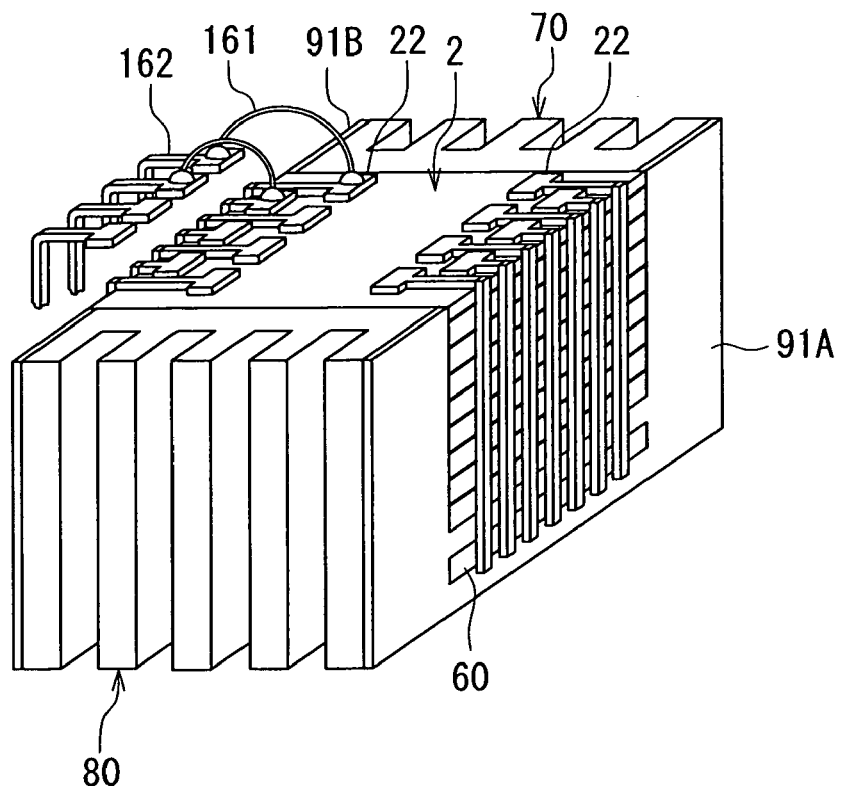
FIG. 10 is a perspective view showing an example of use of the layered chip package shown in FIG. 1.

FIG. 10 shows an example of use of the layered chip package 1. In this example, a plurality of bonding wires 161 are connected to the plurality of pad-shaped terminals 22 of the layered chip package 1 at respective one ends thereof. The respective other ends of the plurality of bonding wires 161 are connected to a plurality of terminals 162 of a device for use with the layered chip package 1.

Figure 11:
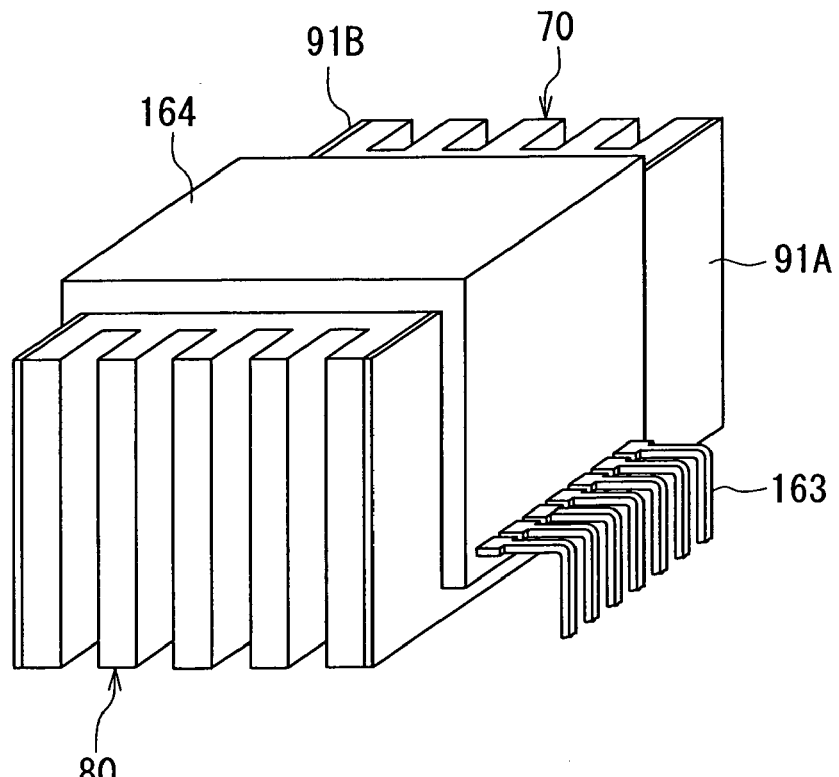
FIG. 11 is a perspective view showing another example of use of the layered chip package shown in FIG. 1.

FIG. 11 shows another example of use of the layered chip package 1. In this example, the layered chip package 1 is mounted to a lead frame having a plurality of pins 163 and is sealed with a molded resin. The wiring 93A, 93B of the layered chip package 1 is connected to the plurality of pins 163. The molded resin forms a protection layer 164 for protecting the layered chip package 1.

Figure 12:
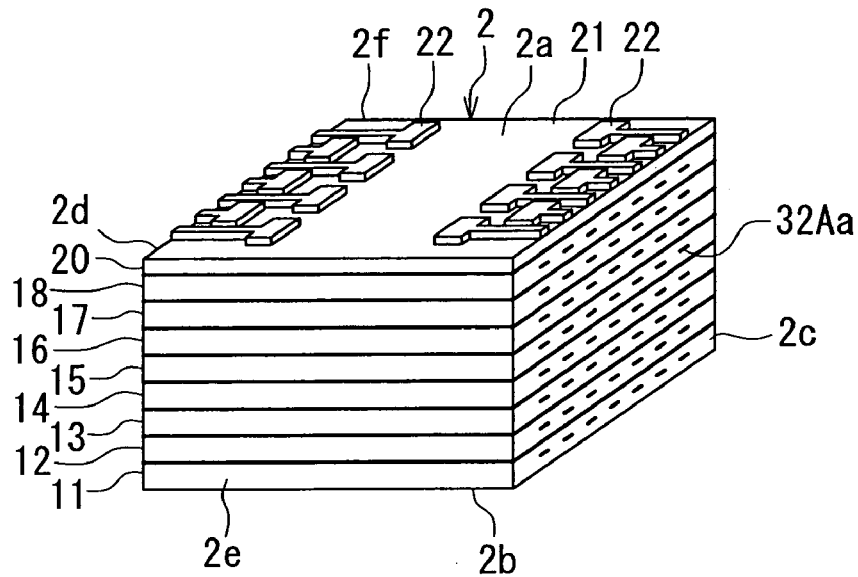
FIG. 12 is a perspective view showing the layer stack of the layered chip package shown in FIG. 1.
Figure 13:
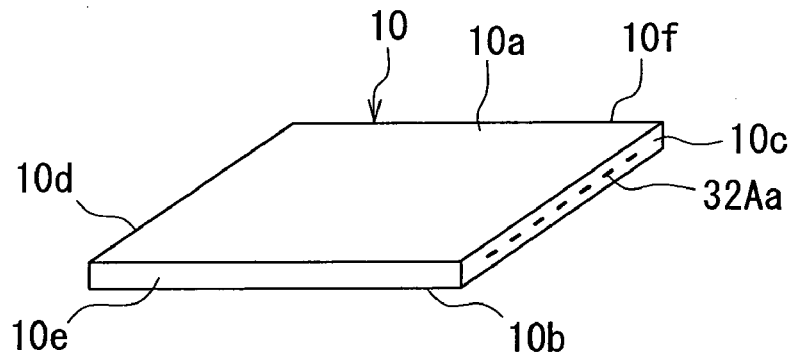
FIG. 13 is a perspective view of one of the layer portions included in the layer stack of FIG. 12.
Figure 14:
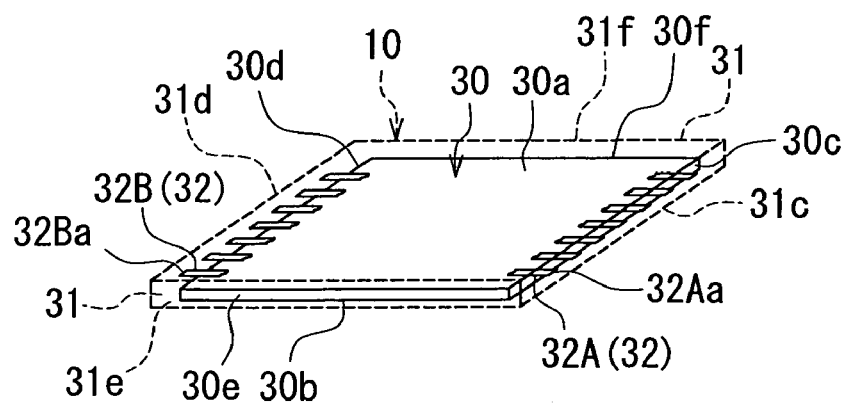
FIG. 14 is a perspective view showing the interior of the layer portion of FIG. 13.

Next, the configuration of the layer stack 2 will be described in detail with reference to FIG. 12 to FIG. 14. FIG. 12 is a perspective view of the layer stack 2. FIG. 13 is a perspective view of one of the layer portions included in the layer stack 2 shown in FIG. 12. FIG. 14 is a perspective view showing the interior of the layer portion shown in FIG. 13. As shown in FIG. 12, the layer stack 2 includes two or more layer portions that are stacked and integrated. By way of example, FIG. 12 shows that the layer stack 2 includes eight layer portions 11, 12, 13, 14, 15, 16, 17 and 18 which are stacked in this order from the bottom. The number of layer portions to be included in the layer stack 2 is not limited to eight, and may be any number no smaller than 2. In the following description, any layer portion will be represented by reference numeral 10.

The layer stack 2 also includes a terminal layer 20 laid on the uppermost layer portion 18. Every vertically adjacent two of the layer portions are bonded to each other with an adhesive, and so are the layer portion 18 and the terminal layer 20 to each other. The terminal layer 20 includes: a terminal layer main body 21 having a top surface, a bottom surface and four side surfaces; and a plurality of pad-shaped terminals 22 disposed on the top surface of the terminal layer main body 21.

As shown in FIG. 13, a layer portion 10 has a top surface 10a, a bottom surface 10b, and four side surfaces 10c, 10d, 10e and 10f. The side surfaces 10c, 10d, 10e and 10f are located in the side surfaces 2c, 2d, 2e and 2f of the layer stack 2, respectively.

As shown in FIG. 14, the layer portion 10 includes a semiconductor chip 30. The semiconductor chip 30 has a top surface 30a, a bottom surface 30b, and four side surfaces 30c, 30d, 30e and 30f. The side surfaces 30c, 30d, 30e and 30f face toward the side surfaces 10c, 10d, 10e and 10f of the layer portion 10, respectively.

The layer portion 10 further includes: an insulating portion 31 covering at least one of the four side surfaces 30c, 30d, 30e and 30f of the semiconductor chip 30; and a plurality of electrodes 32 connected to the semiconductor chip 30. The insulating portion 31 has at least one end face located in at least one of the four side surfaces 10c, 10d, 10e and 10f of the layer portion 10 to which neither of the second portions 72 and 82 of the heat sinks 70 and 80 is adjacent. In the example shown in FIG. 14, the insulating portion 31 covers all of the four side surfaces 30c, 30d, 30e and 30f of the semiconductor chip 30, and has four end faces 31c, 31d, 31e and 31f that are respectively located in the four side surfaces 10c, 10d, 10e and 10f of the layer portion 10. In this example, the insulating portion 31 further covers the top surface 30a of the semiconductor chip 30.

In the example shown in FIG. 14, the plurality of electrodes 32 include a plurality of first electrodes 32A and a plurality of second electrodes 32B. Each of the plurality of first electrodes 32A has an end face 32Aa that is located in the side surface 10c, out of the four side surfaces 10c, 10d, 10e and 10f of the layer portion 10, to which neither of the second portions 72 and 82 of the heat sinks 70 and 80 is adjacent. The end faces 32Aa are each surrounded by the insulating portion 31. Each of the plurality of second electrodes 32B has an end face 32Ba that is located in the side surface 10d, out of the four side surfaces 10c, 10d, 10e and 10f of the layer portion 10, to which neither of the second portions 72 and 82 of the heat sinks 70 and 80 is adjacent. The end faces 32Ba are each surrounded by the insulating portion 31. In the following description, any electrode will be represented by reference numeral 32, and the end face of any electrode 32 will be represented by reference numeral 32a.

The layer portion 60 has the same configuration as that of the layer portion 10 shown in FIG. 13 and FIG. 14. The top surface 60a, the bottom surface 60b and the four side surfaces 60c, 60d, 60e and 60f of the layer portion 60 respectively correspond to the top surface 10a, the bottom surface 10b and the four side surfaces 10c, 10d, 10e and 10f of the layer portion 10.

The semiconductor chip 30 may be a memory chip constituting a memory such as a flash memory, DRAM, SRAM, MRAM, PROM or FeRAM. In this case, a large-capacity memory is provided by the layered chip package 1 including a plurality of semiconductor chips 30. Furthermore, according to the layered chip package 1 of the present embodiment, it is possible to easily implement a memory of various capacities such as 64 GB (gigabytes), 128 GB and 256 GB by changing the number of the semiconductor chips 30 included in the layered chip package 1.

The layered chip package 1 may include a plurality of semiconductor chips 30 serving as memory chips that constitute different types of memory. The layered chip package 1 may include a semiconductor chip 30 serving as a memory chip, and another semiconductor chip 30 serving as a controller for controlling the memory chip.

The layer portion 60 includes a semiconductor chip 30 that generates a large amount of heat during operation, such as a microprocessor. In the present embodiment, the layer portion 60 is therefore separated from the layer stack 2 so as to improve the heat dissipation effect of the layer portion 60 as compared with that of the other layer portions 10 and so that the heat generated by the semiconductor chip 30 in the layer portion 60 will not adversely affect the operation of the semiconductor chips 30 in the other layer portions 10. The layer portion 60 is interposed between the respective first portions 71 and 81 of the heat sinks 70 and 80. The first portion 71 of the heat sink 70 is adjacent to the top surface 60a of the layer portion 60, and the first portion 81 of the heat sink 80 is adjacent to the bottom surface 60b of the layer portion 60. This can improve the heat dissipation effect of the layer portion 60. Since the first portion 71 of the heat sink 70 is interposed between the layer portion 60 and the layer stack 2, the heat generated by the semiconductor chip 30 in the layer portion 60 is prevented from being transferred to the layer stack 2 and adversely affecting the operation of the plurality of semiconductor chips 30 in the plurality of layer portions 10 included in the layer stack 2.

In the present embodiment, the second portion 72 of the first heat sink 70 is adjacent to the side surface 2f of the layer stack 2, i.e., the respective side surfaces 10f of the plurality of layer portions 10 included in the layer stack 2. The second portion 82 of the second heat sink 80 is adjacent to the side surface 60e of the layer portion 60 and the side surface 2e of the layer stack 2, i.e., the respective side surfaces 10e of the plurality of layer portions 10 included in the layer stack 2. The side surface 2f of the layer stack 2 corresponds to the first side surface of the layer stack according to the present invention. The side surface 2e of the layer stack 2 corresponds to the second side surface of the layer stack according to the present invention. Consequently, each of the second portion 72 of the heat sink 70 and the second portion 82 of the heat sink 80 is adjacent to one side surface of each of at least two of the plurality of layer portions 10 and 60 included in the layered chip package 1. In the present embodiment, the second portions 72 and 82 of the heat sinks 70 and 80 extend in the vertical direction (the stacking direction of the plurality of layer portions 10 and 60) without spreading out in the horizontal direction (the direction orthogonal to the stacking direction of the plurality of layer portions 10 and 60). This makes it possible to improve the heat dissipation effect of the layered chip package 1 without increasing the layered chip package 1 in size.

Manufacturing methods for the layer stack 2 and the layer portion 60 will now be described. The manufacturing method for the layer stack 2 includes the steps of: fabricating a layered substructure; and fabricating a plurality of layer stacks 2 by using the layered substructure. In the step of fabricating the layered substructure, the layered substructure is fabricated by stacking a plurality of substructures in correspondence with the order of stacking of the plurality of layer portions 10 of the layer stack 2. The plurality of substructures respectively correspond to the plurality of layer portions 10 of the layer stack 2. Each substructure includes a plurality of its corresponding layer portions 10 and will be cut later at a boundary between every adjacent ones of the plurality of its corresponding layer portions 10. The plurality of substructures may each include a plurality of layer portions 10 of the same type.

The step of fabricating the layered substructure will now be described with reference to FIG. 15 to FIG. 31. In the step of fabricating the layered substructure, first, a plurality of pre-substructure wafers that respectively correspond to the plurality of layer portions 10 of the layer stack 2 are fabricated.

Figure 15:
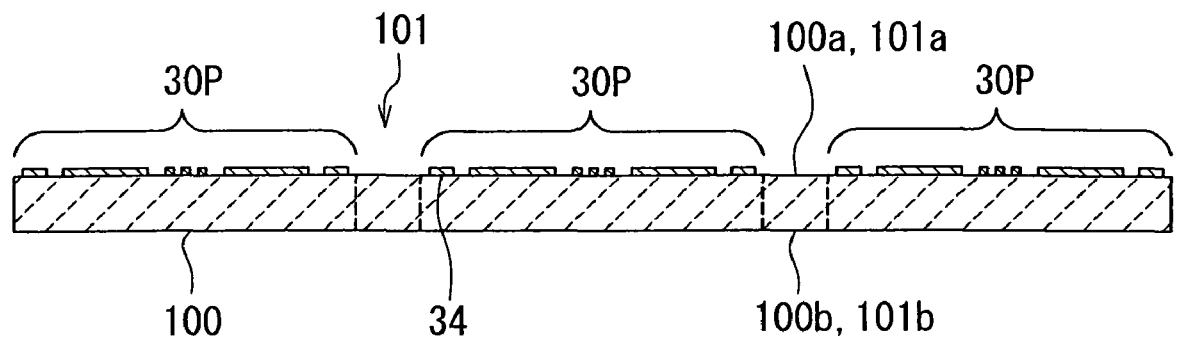
FIG. 15 is a cross-sectional view of a portion of a pre-substructure wafer fabricated in a step of a manufacturing method for the layer stack of the first embodiment of the invention.

FIG. 15 shows a step of fabricating a single pre-substructure wafer. In this step, a semiconductor wafer 100 having a first surface 100a and a second surface 100b that face toward opposite directions is subjected to processing, such as a wafer process, at the first surface 100a, to thereby fabricate a pre-substructure wafer 101 that includes a plurality of pre-semiconductor-chip portions 30P aligned. The plurality of pre-semiconductor-chip portions 30P each include a device, and are to become the plurality of semiconductor chips 30 later. The plurality of pre-semiconductor-chip portions 30P of the pre-substructure wafer 101 may later become a plurality of the same type of semiconductor chips 30. The pre-substructure wafer 101 has a first surface 101a corresponding to the first surface 100a of the semiconductor wafer 100, and a second surface 101b corresponding to the second surface 100b of the semiconductor wafer 100. In the pre-substructure wafer 101, the plurality of pre-semiconductor-chip portions 30P may be aligned in a row, or may be aligned in a plurality of rows such that a plurality of ones of the pre-semiconductor-chip portions 30P are aligned in each of vertical and horizontal directions. In the following description, it is assumed that the plurality of pre-semiconductor-chip portions 30P are aligned in a plurality of rows such that a plurality of ones of the pre-semiconductor-chip portions 30P are aligned in each of vertical and horizontal directions in the pre-substructure wafer 101.

The semiconductor wafer 100 may be a silicon wafer, for example. The wafer process is a process in which a wafer is processed into a plurality of devices that are not yet separated into a plurality of chips. In the pre-substructure wafer 101, the first surface 101a is a device formation surface on which devices are formed. Each of the plurality of pre-semiconductor-chip portions 30P has a plurality of pad-shaped electrodes 34 disposed on the first surface 101a of the pre-substructure wafer 101.

Figure 24:
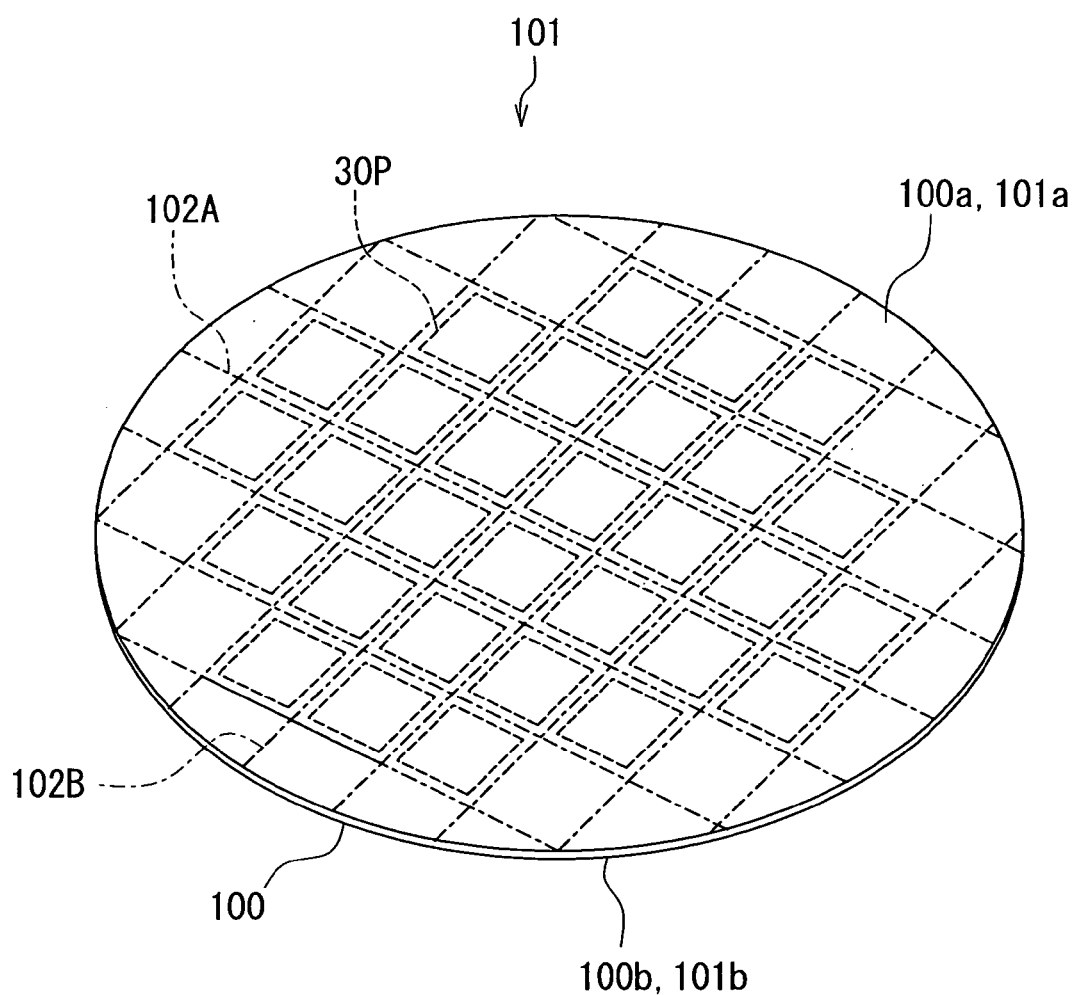
FIG. 24 is a perspective view of the pre-substructure wafer fabricated in the step of FIG. 15.

FIG. 24 is a perspective view of the pre-substructure wafer 101. As shown in FIG. 24, the pre-substructure wafer 101 is provided with a plurality of scribe lines 102A and a plurality of scribe lines 102B. The scribe lines 102A extend horizontally to pass through boundaries between every two pre-semiconductor-chip portions 30P that are vertically adjacent to each other. The scribe lines 102B extend vertically to pass through boundaries between every two pre-semiconductor-chip portions 30P that are horizontally adjacent to each other.

Figure 25:
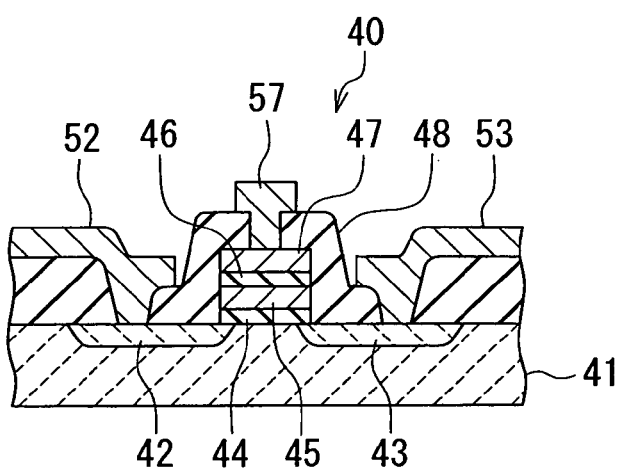
FIG. 25 is a cross-sectional view showing an example of the internal structure of a pre-semiconductor-chip portion of the pre-substructure wafer of FIG. 24.

FIG. 25 is a cross-sectional view illustrating an example of the internal structure of each pre-semiconductor-chip portion 30P of the pre-substructure wafer 101 of FIG. 24. Here is given an example in which a plurality of memory cells of a flash memory are formed as a device in the pre-semiconductor-chip portion 30P. FIG. 25 shows one of the plurality of memory cells as a device formed in the pre-semiconductor-chip portion 30P. The memory cell 40 includes a source 42 and a drain 43 formed near a surface of a P-type silicon substrate 41 composed of the semiconductor wafer 100, i.e., near the first surface 100a of the semiconductor wafer 100. The source 42 and the drain 43 are both N-type regions. The source 42 and the drain 43 are disposed at a predetermined distance from each other so that a channel composed of a portion of the P-type silicon substrate 41 is provided between the source 42 and the drain 43. The memory cell 40 further includes an insulating film 44, a floating gate 45, an insulating film 46 and a control gate 47 that are stacked in this order on the surface of the substrate 41 at the location between the source 42 and the drain 43. The memory cell 40 further includes an insulating layer 48 covering the source 42, the drain 43, the insulating film 44, the floating gate 45, the insulating film 46 and the control gate 47. The insulating layer 48 has contact holes that open at the tops of the source 42, the drain 43 and the control gate 47, respectively. The memory cell 40 includes a source electrode 52, a drain electrode 53, and a control gate electrode 57 that are formed on the insulating layer 48 at locations above the source 42, the drain 43 and the control gate 47, respectively. The source electrode 52, the drain electrode 53 and the control gate electrode 57 are connected to the source 42, the drain 43 and the control gate 47, respectively, through the respective contact holes.

A plurality of pre-substructure wafers 101 that respectively correspond to the plurality of layer portions 10 of the layer stack 2 are each fabricated through the step described with reference to FIG. 15.

Figure 16:
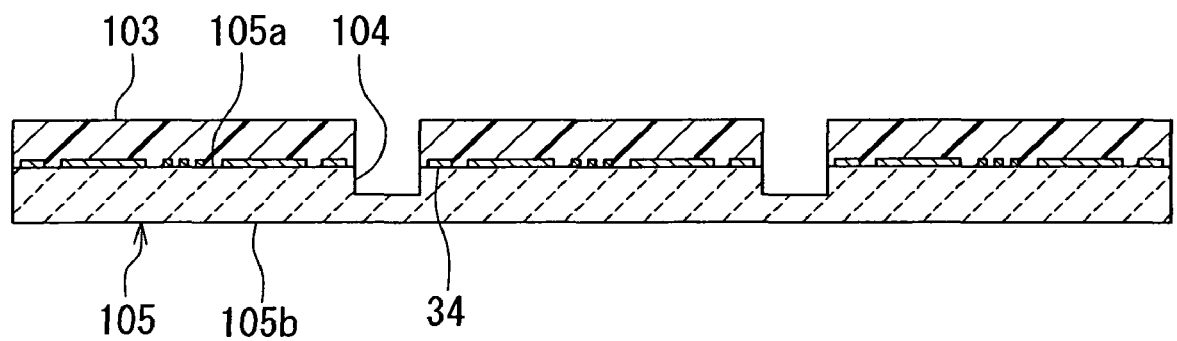
FIG. 16 is a cross-sectional view of a portion of a pre-polishing substructure main body fabricated in a step that follows the step of FIG. 15.

FIG. 16 shows a step that follows the step of FIG. 15. In this step, first, a protection film 103 made of, for example, photoresist, is formed to cover the entire first surface 101a of the pre-substructure wafer 101. Next, at least one groove 104 is formed in the pre-substructure wafer 101. The at least one groove 104 opens at the first surface 101a of the pre-substructure wafer 101 and extends to be adjacent to at least one of the pre-semiconductor-chip portions 30P. Here, a plurality of grooves 104 are formed as shown in FIG. 16. At the positions of the boundaries between every two adjacent pre-semiconductor-chip portions 30P, the grooves 104 are formed to pass through the boundaries between every two adjacent pre-semiconductor-chip portions 30P. In this way, a pre-polishing substructure main body 105 is formed by the pre-substructure wafer 101 having undergone the formation of the plurality of grooves 104 therein. The pre-polishing substructure main body 105 includes the plurality of pre-semiconductor-chip portions 30P. The pre-polishing substructure main body 105 has a first surface 105a and a second surface 105b. The first surface 105a corresponds to the first surface 100a of the semiconductor wafer 100 and the first surface 101a of the pre-substructure wafer 101. The second surface 105b corresponds to the second surface 100b of the semiconductor wafer 100 and the second surface 101b of the pre-substructure wafer 101. The pre-polishing substructure main body 105 further has the plurality of grooves 104 that open at the first surface 105a. In the pre-polishing substructure main body 105, the first surface 105a is a device formation surface on which devices are formed.

The plurality of grooves 104 are formed along the scribe lines 102A and 102B shown in FIG. 24. The grooves 104 are formed such that their bottoms do not reach the second surface 101b of the pre-substructure wafer 101. The grooves 104 are each 10 to 150 µm wide, for example. The grooves 104 are each 30 to 150 µm deep, for example. The grooves 104 may be formed using a dicing saw, or by etching such as reactive ion etching.

Figure 26:
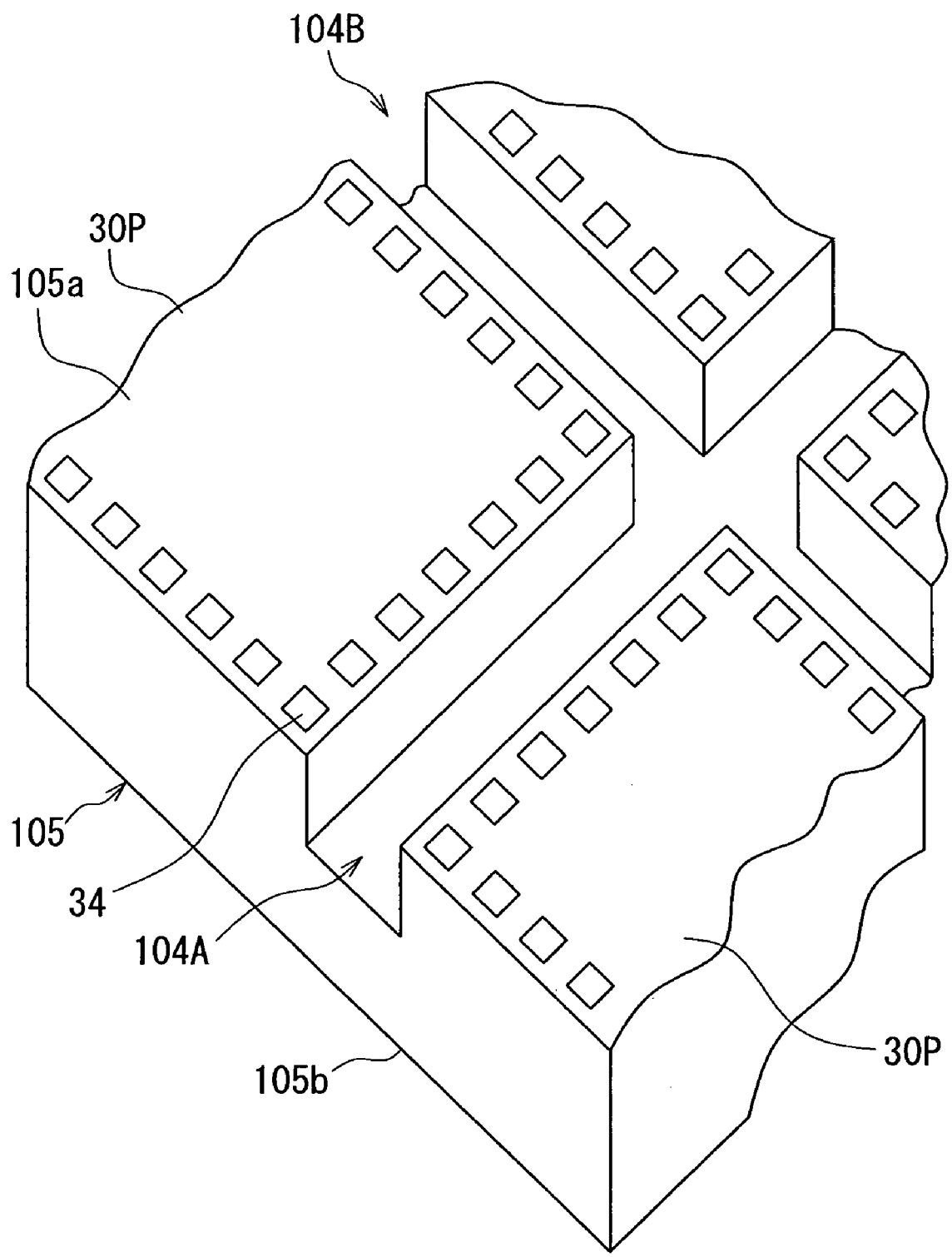
FIG. 26 is a perspective view of a portion of the pre-polishing substructure main body fabricated in the step of FIG. 16.

FIG. 26 shows a portion of the pre-polishing substructure main body 105 fabricated in the step of FIG. 16. In the present embodiment, the plurality of grooves 104 include a plurality of first grooves 104A and a plurality of second grooves 104B. The first grooves 104A and the second grooves 104B extend in directions orthogonal to each other. FIG. 26 shows only one each of the first and second grooves 104A and 104B. The first grooves 104A are formed along the scribe lines 102A shown in FIG. 24, and the second grooves 104B are formed along the scribe lines 102B shown in FIG. 24.

Figure 17:
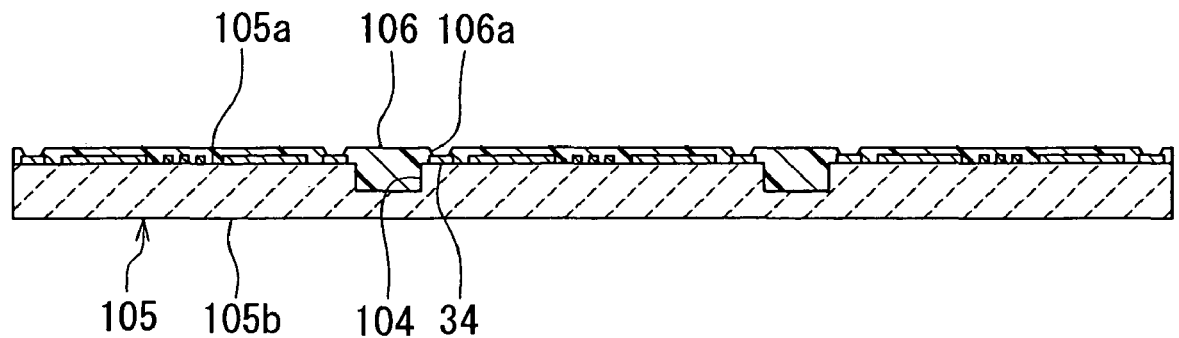
FIG. 17 is a cross-sectional view of a portion of a structure fabricated in a step that follows the step of FIG. 16.

FIG. 17 shows a step that follows the step of FIG. 16. In this step, first, an insulating layer 106 is formed to fill the plurality of grooves 104 of the pre-polishing substructure main body 105 and to cover the plurality of pad-shaped electrodes 34. The insulating layer 106 will later become part of the insulating portion 31. Next, a plurality of openings 106a for exposing the pad-shaped electrodes 34 are formed in the insulating layer 106.

The insulating layer 106 may be formed of a resin such as an epoxy resin or a polyimide resin. The insulating layer 106 may also be formed of a photosensitive material such as a polyimide resin containing a sensitizer. If the insulating layer 106 is formed of a photosensitive material, the openings 106a of the insulating layer 106 may be formed by photolithography. If the insulating layer 106 is formed of a non-photosensitive material, the openings 106a of the insulating layer 106 may be formed by selectively etching the insulating layer 106.

The insulating layer 106 may include a first layer that fills the grooves 104, and a second layer that covers the first layer and the pad-shaped electrodes 34. In this case, the openings 106a are formed in the second layer. Both of the first layer and the second layer may be formed of a resin such as an epoxy resin or a polyimide resin. The second layer may be formed of a photosensitive material such as a polyimide resin containing a sensitizer. If the second layer is formed of a photosensitive material, the openings 106a may be formed in the second layer by photolithography. If the second layer is formed of a non-photosensitive material, the openings 106a may be formed in the second layer by selectively etching the second layer.

It is preferable that the insulating layer 106 be formed of a resin having a low thermal expansion coefficient. Forming the insulating layer 106 of a resin having a low thermal expansion coefficient serves to facilitate cutting of the insulating layer 106 when the insulating layer 106 is cut later with a dicing saw.

It is preferable that the insulating layer 106 be transparent. If the insulating layer 106 is transparent, it is possible to easily recognize alignment marks that will be formed on the insulating layer 106 later, through the insulating layer 106.

Figure 18:
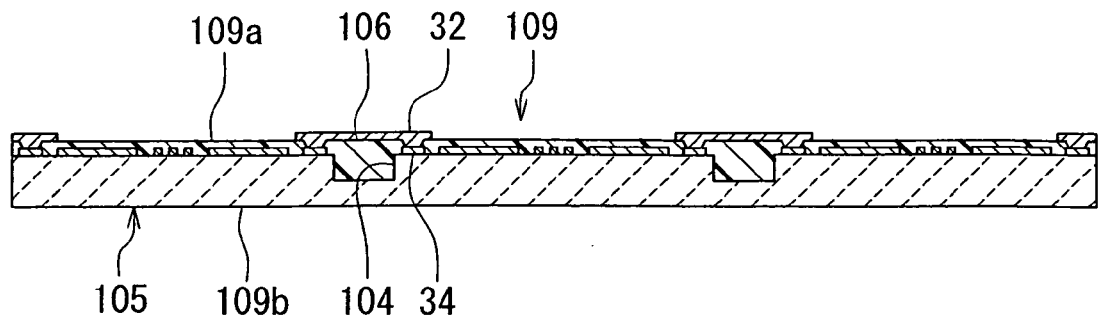
FIG. 18 is a cross-sectional view of a portion of a pre-polishing substructure fabricated in a step that follows the step of FIG. 17.
Figure 27:
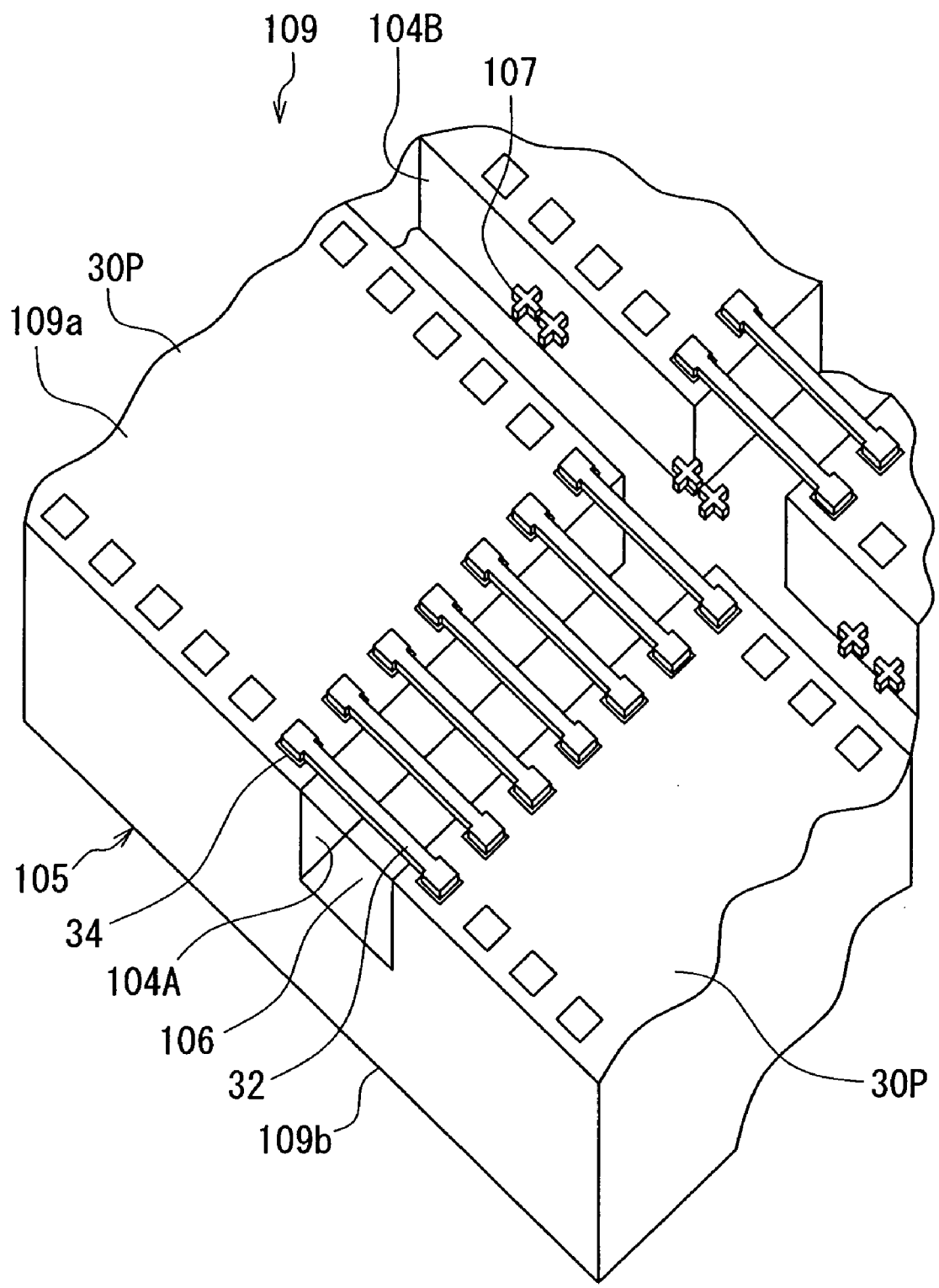
FIG. 27 is a perspective view of a portion of the pre-polishing substructure fabricated in the step of FIG. 18.

FIG. 18 shows a step that follows the step of FIG. 17. In this step, the plurality of electrodes 32 are formed such that part of each of the electrodes 32 lies on the insulating layer 106. The electrodes 32 are connected to the pad-shaped electrodes 34 through the openings 106a. FIG. 27 shows a portion of the structure fabricated in the step of FIG. 18. FIG. 18 and FIG. 27 show an example in which electrodes 32 extending from one of two adjacent pre-semiconductor-chip portions 30P are coupled to those extending from the other of the two adjacent pre-semiconductor-chip portions 30P. However, it is not necessarily required that electrodes 32 extending from one of two adjacent pre-semiconductor-chip portions 30P be coupled to those extending from the other of the two adjacent pre-semiconductor-chip portions 30P.

The electrodes 32 are formed of a conductive material such as Cu. The electrodes 32 are formed by frame plating, for example. In this case, first, a seed layer for plating is formed on the insulating layer 106. Next, a frame having grooves is formed on the seed layer. The frame is formed by patterning a photoresist layer by photolithography, for example. Next, plating layers to become part of the electrodes 32 are formed by plating on the seed layer in the grooves of the frame. Next, the frame is removed and the seed layer except portions thereof located below the plating layers is also removed by etching. As a result, the electrodes 32 are formed of the plating layers and the portions of the seed layer remaining therebelow.

As shown in FIG. 27, in the step of forming the plurality of electrodes 32, a plurality of alignment marks 107 are formed on the insulating layer 106 simultaneously with the formation of the plurality of electrodes 32. The alignment marks 107 are disposed above the grooves 104. The material and forming method of the alignment marks 107 are the same as those of the electrodes 32.

A pre-polishing substructure 109 shown in FIG. 18 and FIG. 27 is thus fabricated. The pre-polishing substructure 109 includes: the pre-polishing substructure main body 105; the insulating layer 106 that fills the grooves 104 of the pre-polishing substructure main body 105 and that will later become part of the insulating portion 31; the plurality of electrodes 32 each having a portion lying on the insulating layer 106; and the plurality of alignment marks 107 disposed on the insulating layer 106. The pre-polishing substructure 109 has a first surface 109a and a second surface 109b. The first surface 109a corresponds to the first surface 100a of the semiconductor wafer 100 and the first surface 101a of the pre-substructure wafer 101. The second surface 109b corresponds to the second surface 100b of the semiconductor wafer 100 and the second surface 101b of the pre-substructure wafer 101.

A plurality of pre-polishing substructures 109 that respectively correspond to the plurality of layer portions 10 of the layer stack 2 are each fabricated through the steps described with reference to FIG. 16 to FIG. 18.

Figure 19:
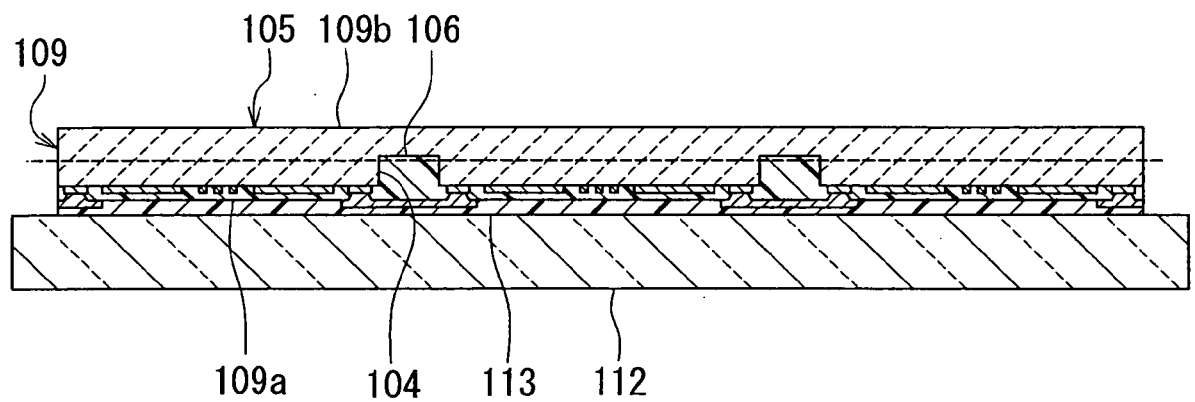
FIG. 19 is a cross-sectional view of a portion of a structure fabricated in a step that follows the step of FIG. 18.

FIG. 19 shows a step that follows the step of FIG. 18. In this step, a pre-polishing substructure 109 is bonded to a plate-shaped jig 112 shown in FIG. 19 with an insulating adhesive such that the first surface 109a of the pre-polishing substructure 109 faces a surface of the jig 112. The pre-polishing substructure 109 bonded to the jig 112 will be hereinafter called a first pre-polishing substructure 109. The pre-substructure wafer 101 serving as a basis for fabricating the first pre-polishing substructure 109 will be hereinafter called a first pre-substructure wafer 101. An insulating layer 113 formed by the adhesive covers the electrodes 32 and will become part of the insulating portion 31. It is preferred that the insulating layer 113 be transparent.

Next, the second surface 109b of the first pre-polishing substructure 109 is polished. This polishing is performed until the plurality of grooves 104 become exposed. In FIG. 19 the broken line indicates the position of the surface 109b after the polishing. As a result of polishing the second surface 109b of the first pre-polishing substructure 109, the first pre-polishing substructure 109 is thinned by the polishing and thereby a substructure 110 is formed in the state of being bonded to the jig 112. The substructure 110 has a thickness of, for example, 30 to 100 μm.

Figure 20:
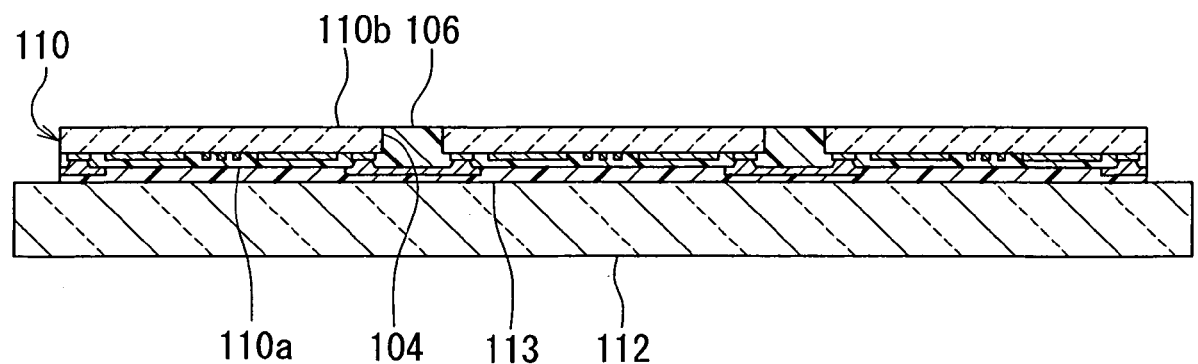
FIG. 20 is a cross-sectional view of a portion of a substructure fabricated in a step that follows the step of FIG. 19.

FIG. 20 shows the substructure 110 bonded to the jig 112. The substructure 110 bonded to the jig 112 will be hereinafter called a first substructure 110. The first substructure 110 has a first surface 110a corresponding to the first surface 109a of the first pre-polishing substructure 109, and a second surface 110b opposite to the first surface 110a. The second surface 110b is the polished surface.

Figure 28:
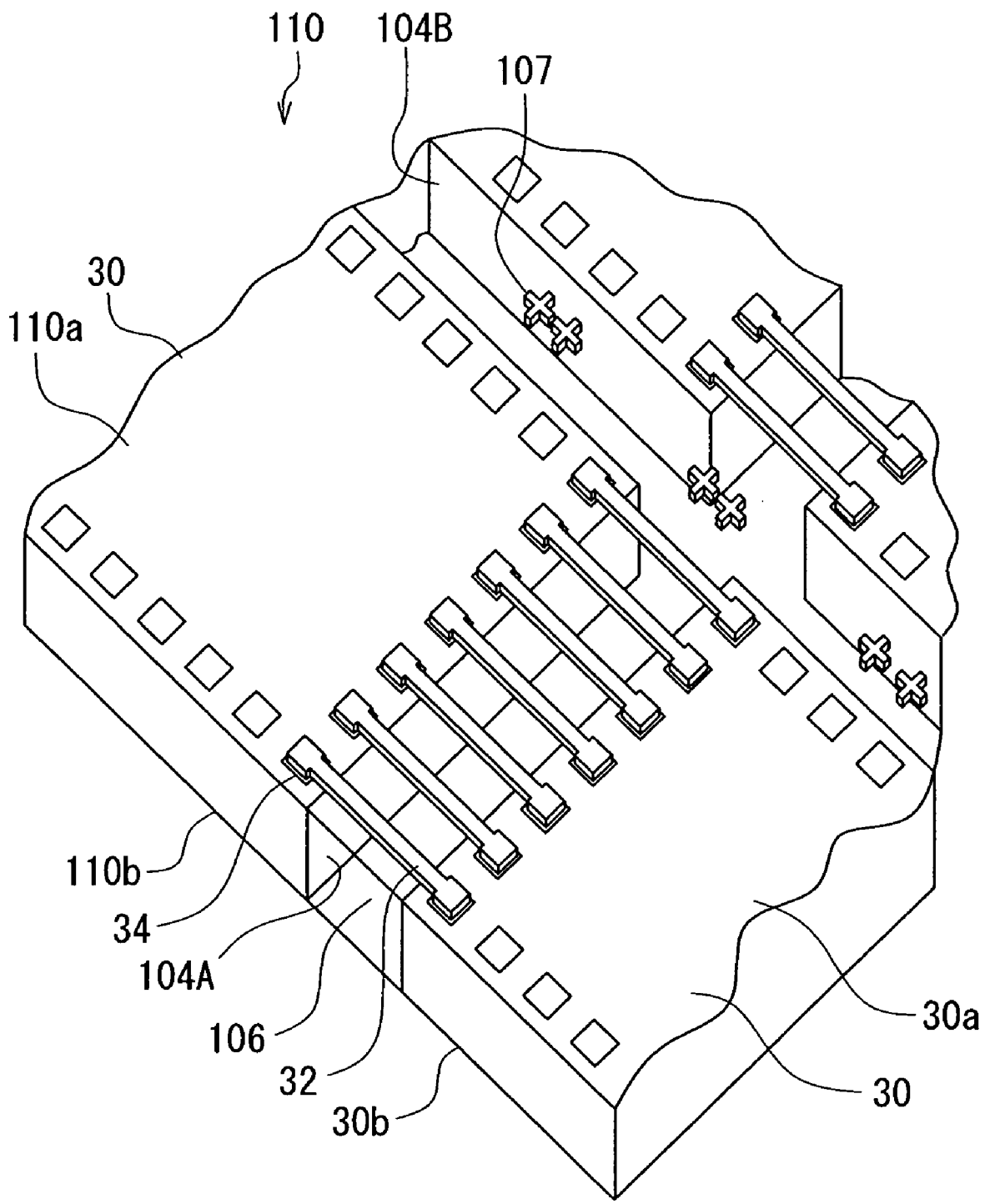
FIG. 28 is a perspective view of a portion of the substructure fabricated in the step of FIG. 20.

FIG. 28 shows a portion of the first substructure 110 fabricated in the step of FIG. 20. As previously described, by polishing the second surface 109b of the first pre-polishing substructure 109 until the grooves 104 become exposed, the plurality of pre-semiconductor-chip portions 30P are separated from each other and thereby become the semiconductor chips 30.

Figure 21:
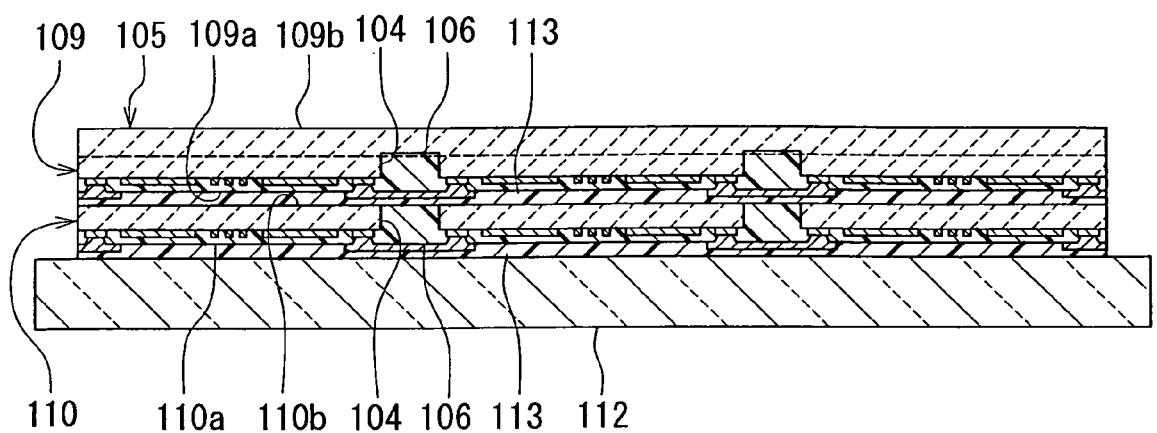
FIG. 21 is a cross-sectional view of a portion of a stack of layers fabricated in a step that follows the step of FIG. 20.

FIG. 21 shows a step that follows the step of FIG. 20. In this step, a pre-polishing substructure 109 is bonded with an insulating adhesive to the first substructure 110 bonded to the jig 112. The pre-polishing substructure 109 is bonded to the first substructure 110 such that the first surface 109a faces the polished surface, that is, the second surface 110b, of the first substructure 110. The pre-polishing substructure 109 to be bonded to the first substructure 110 will be hereinafter called a second pre-polishing substructure 109. The pre-substructure wafer 101 serving as a basis for fabricating the second pre-polishing substructure 109 will be hereinafter called a second pre-substructure wafer 101. An insulating layer 113 formed by the adhesive covers the electrodes 32 and will become part of the insulating portion 31. It is preferred that the insulating layer 113 be transparent.

Next, the second surface 109b of the second pre-polishing substructure 109 is polished. This polishing is performed until the plurality of grooves 104 become exposed. In FIG. 21 the broken line indicates the position of the surface 109b after the polishing. As a result of polishing the second surface 109b of the second pre-polishing substructure 109, the second pre-polishing substructure 109 is thinned by the polishing and thereby a substructure 110 is formed in the state of being stacked on the first substructure 110. This substructure 110 stacked on the first substructure 110 will be hereinafter called a second substructure 110.

Figure 22:
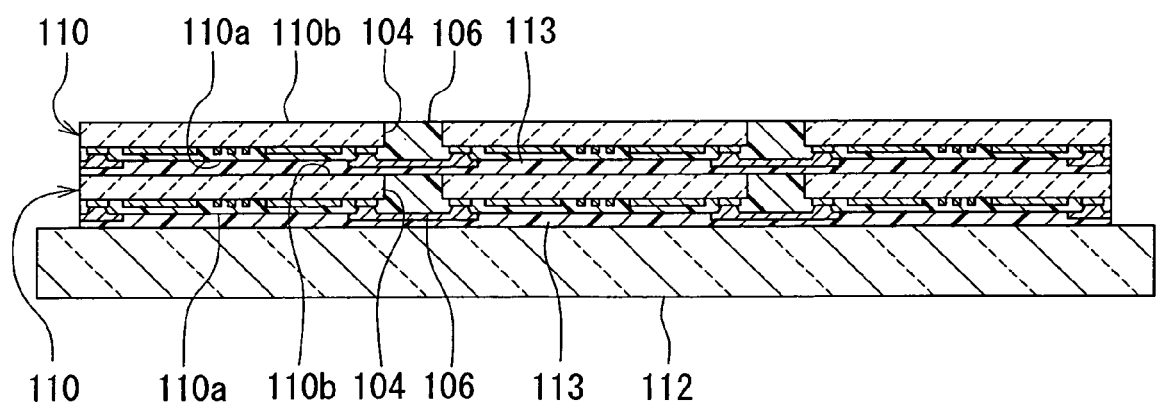
FIG. 22 is a cross-sectional view of a portion of a stack of layers fabricated in a step that follows the step of FIG. 21.

FIG. 22 shows a state in which the second surface 109b of the second pre-polishing substructure 109 has been polished and the first and second substructures 110 have been stacked on the jig 112. The second substructure 110 has a first surface 110a corresponding to the first surface 109a of the second pre-polishing substructure 109, and a second surface 110b opposite to the first surface 110a. The second surface 110b is the polished surface. The second substructure 110 has a thickness of, for example, 30 to 100 μm, as does the first substructure 110.

Here, if the insulating layers 106 and 113 are transparent, using a transparent jig such as an acrylic plate or a glass plate as the jig 112 makes it possible that the alignment marks 107 of the first substructure 110 and the second pre-polishing substructure 109 are visible from the outside of the jig 112 when the second pre-polishing substructure 109 is bonded to the first substructure 110. As a result, it is possible, through the use of the alignment marks 107, to perform alignment of the first substructure 110 and the second pre-polishing substructure 109.

Figure 23:
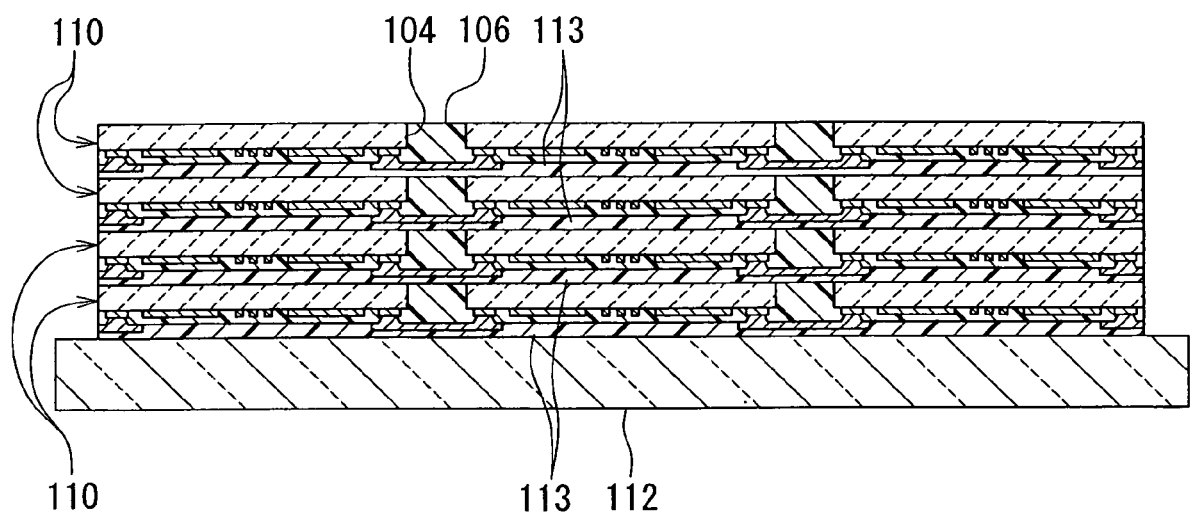
FIG. 23 is a cross-sectional view of a portion of a stack of layers fabricated in a step that follows the step of FIG. 22.

One or more additional substructures 110 may be stacked on the second substructure 110 by repeating the steps shown in FIG. 21 and FIG. 22 so that a total of three or more substructures 110 may be stacked on the jig 112. Here, by way of example, four substructures 110 shall be stacked on the jig 112 as shown in FIG. 23. In the present embodiment, the number of the substructures 110 to be stacked on the jig 112 may be any number no smaller than 2.

Figure 29:
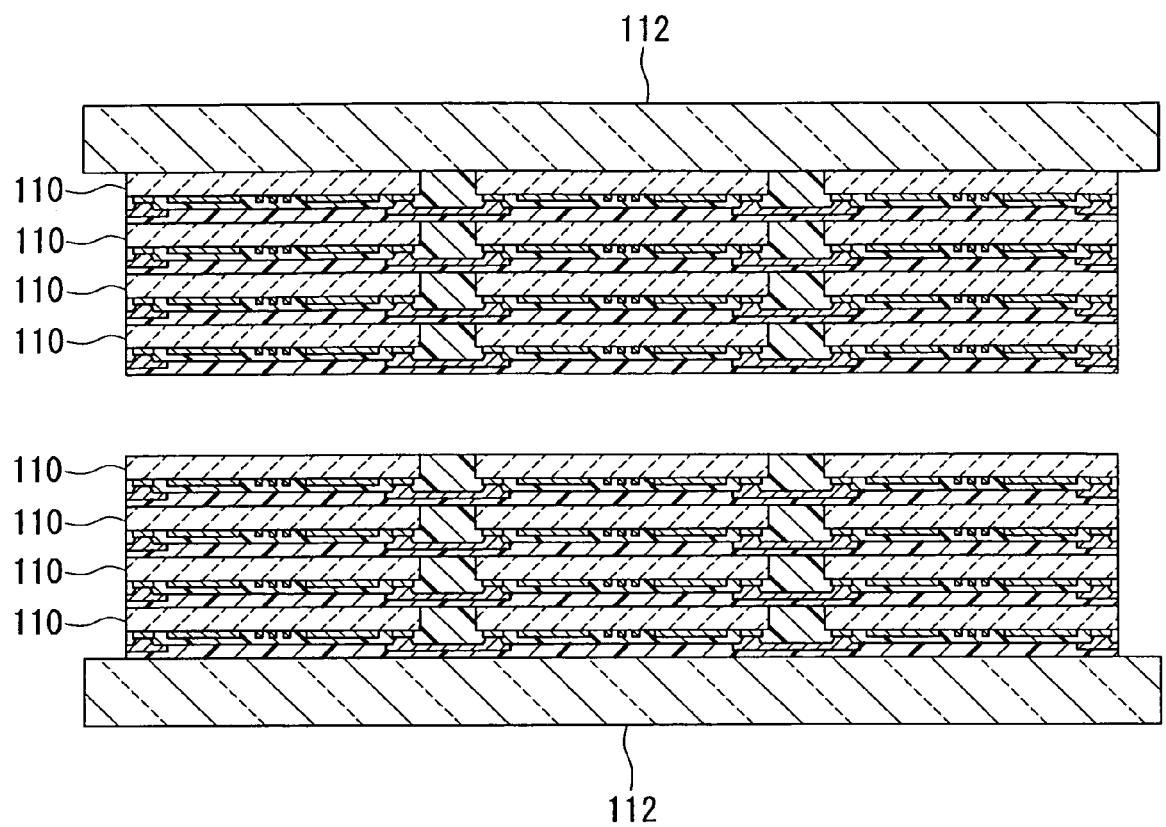
FIG. 29 is an illustrative view showing a step that follows the step of FIG. 23.

FIG. 29 shows a step that follows the step of FIG. 23. In this step, two stacks each of which includes four substructures 110 are prepared and the two stacks are bonded to each other to thereby fabricate a stack including eight substructures 110. The two stacks each including four substructures 110 are each fabricated through the steps shown in FIG. 19 to FIG. 23. The combination of the jig 112 and the stack of four substructures 110 shown on the upper side of FIG. 29 is fabricated by separating the jig 112 from the stack shown in FIG. 23 and then bonding the jig 112 to a surface of this stack opposite to the surface to which the jig 112 was initially bonded. In this way, by re-bonding the jig 112 for one of the two stacks to be bonded to each other, it is possible to stack eight substructures 110 such that the relative vertical positions of the first surface and the second surface are the same among the eight substructures 110, as shown in FIG. 29.

Figure 30:
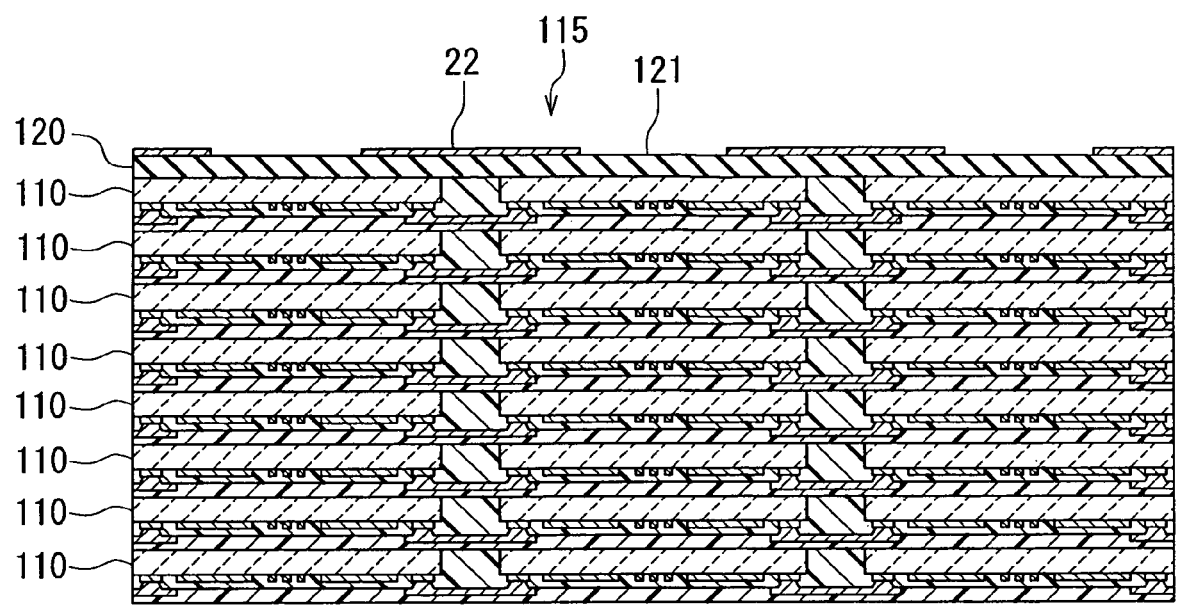
FIG. 30 is a cross-sectional view of a portion of a layered substructure fabricated in a step that follows the step of FIG. 29.
Figure 31:
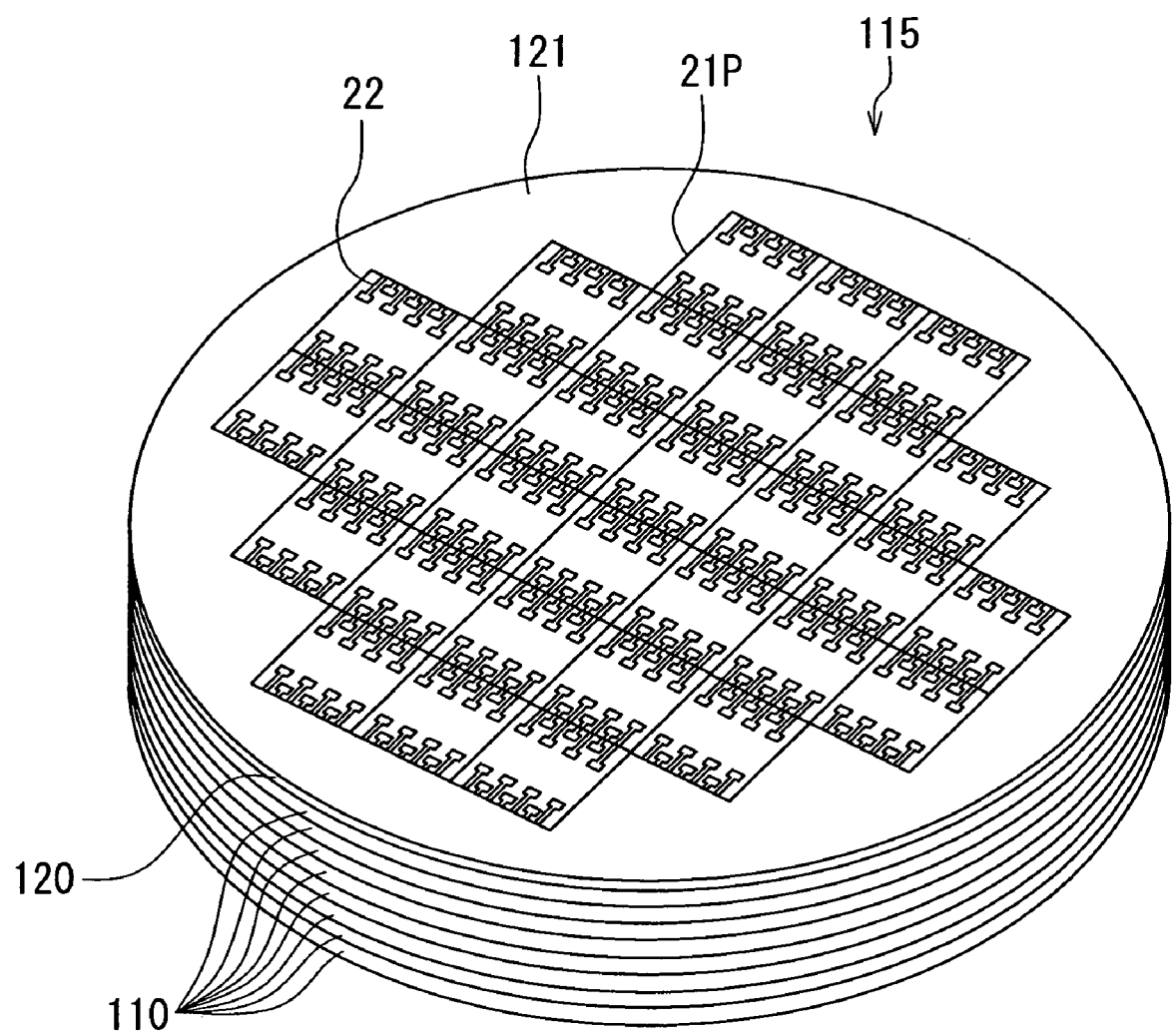
FIG. 31 is a perspective view of the layered substructure fabricated in the step that follows the step of FIG. 29.

FIG. 30 and FIG. 31 show a step that follows the step of FIG. 29. In this step, a layered substructure 115 is fabricated by stacking a terminal wafer 120 on the uppermost one of the eight substructures 110 included in the stack fabricated in the step of FIG. 29. The terminal wafer 120 has a wafer main body 121 that is plate-shaped and formed of an insulating material such as a resin or ceramic. The wafer main body 121 includes a plurality of pre-terminal-layer-body portions 21P that will be separated from each other later to thereby become the terminal layer main bodies 21. The terminal wafer 120 further includes a plurality of groups of pad-shaped terminals 22 disposed on the top surface of the wafer main body 121. One each group of pad-shaped terminals 22 is disposed in each pre-terminal-layer-body portion 21P. FIG. 30 and FIG. 31 show an example in which, at the boundaries between every two adjacent pre-terminal-layer-body portions 21P, pad-shaped terminals 22 disposed in one of the two adjacent pre-terminal-layer-body portions 21P are coupled to those disposed in the other of the two adjacent pre-terminal-layer-body portions 21P. However, it is not necessarily required that pad-shaped terminals 22 disposed in one of two adjacent pre-terminal-layer-body portions 21P be coupled to those disposed in the other of the two adjacent pre-terminal-layer-body portions 21P. The wafer main body 121 may be transparent. In this case, alignment marks may be provided on the top surface of the wafer main body 121 at the positions of the boundaries between every two adjacent pre-terminal-layer-body portions 21P.

In the present embodiment, the step of fabricating the layered substructure 115 includes: the step of fabricating the first pre-substructure wafer 101; the step of fabricating the second pre-substructure wafer 101; the step of fabricating the first pre-polishing substructure 109 by using the first pre-substructure wafer 101; the step of fabricating the second pre-polishing substructure 109 by using the second pre-substructure wafer 101; the step of bonding the first pre-polishing substructure 109 to the jig 112; the first polishing step of polishing the second surface 109b of the first pre-polishing substructure 109 so as to form the first substructure 110; the step of bonding the second pre-polishing substructure 109 to the first substructure 110; and the second polishing step of polishing the second surface 109b of the second pre-polishing substructure 109 so as to form the second substructure 110.

Each of the first and second pre-substructure wafers 101 is fabricated through the step described with reference to FIG. 15. Each of the first and second pre-polishing substructures 109 is fabricated through the steps described with reference to FIG. 16 to FIG. 18. In the step of bonding the first pre-polishing substructure 109 to the jig 112, as shown in FIG. 19, the first pre-polishing substructure 109 is bonded to the jig 112 such that the first surface 109a of the first pre-polishing substructure 109 faces the jig 112. In the first polishing step, as shown in FIG. 19 and FIG. 20, the second surface 109b of the first pre-polishing substructure 109 is polished so that the first pre-polishing substructure 109 is thinned by the polishing and thereby the first substructure 110 is formed in the state of being bonded to the jig 112. In the step of bonding the second pre-polishing substructure 109 to the first substructure 110, as shown in FIG. 21, the second pre-polishing substructure 109 is bonded to the first substructure 110 such that the first surface 109a of the second pre-polishing substructure 109 faces the polished surface, that is, the second surface 110b, of the first substructure 110. In the second polishing step, the second surface 109b of the second pre-polishing substructure 109 is polished so that the second pre-polishing substructure 109 is thinned by the polishing and thereby the second substructure 110 is formed in the state of being stacked on the first substructure 110.

If each pre-polishing substructure 109 is polished alone into the substructure 110, the substructure 110 becomes difficult to handle and also becomes susceptible to damage as the substructure 110 is made thin to a thickness of, for example, 30 to 100 µm. In addition, because of a difference in thermal expansion coefficient between the semiconductor chip 30 and the insulating layer 106 in the substructure 110, the substructure 110 will become curved as it becomes thin. This also makes it difficult to handle the substructure 110 and makes the substructure 110 susceptible to damage.

According to the present embodiment, the first pre-polishing substructure 109 is polished in the state of being bonded to the jig 112. This facilitates handling of the first substructure 110 formed by thinning the first pre-polishing substructure 109 by the polishing, and makes the first substructure 110 resistant to damage. In addition, the second pre-polishing substructure 109 is polished in the state of being bonded to the first substructure 110 bonded to the jig 112. This facilitates handling of the second substructure 110 formed by thinning the second pre-polishing substructure 109 by the polishing, and makes the second substructure 110 resistant to damage. The same holds true for one or more additional substructures 110 to be stacked on the second substructure 110.

In the present embodiment, the method of fabricating the layered substructure 115 is not limited to the method described with reference to FIG. 15 to FIG. 31. For example, the layered substructure 115 can be fabricated through: bonding two pre-polishing substructures 109 to each other such that the respective first surfaces 109a face toward each other; polishing the respective second surfaces 109b of the two pre-polishing substructures 109 and thereby forming a stack including two substructures 110; and stacking a plurality of such stacks. Alternatively, the layered substructure 115 can be fabricated through: bonding two substructures 110 to each other such that the respective second surfaces 110b face toward each other and thereby forming a stack of the two substructures 110; and stacking a plurality of such stacks.

Figure 32:
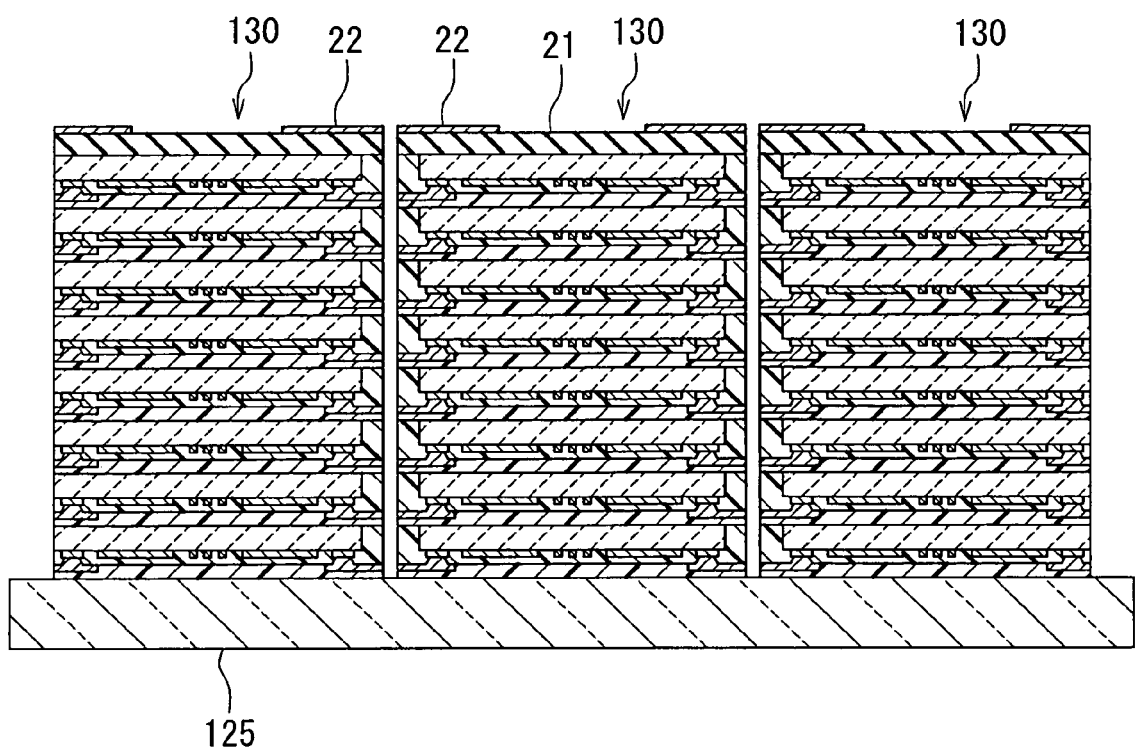
FIG. 32 is a cross-sectional view of a portion of a main body aggregate fabricated in a step that follows the step of FIG. 30.
Figure 33:
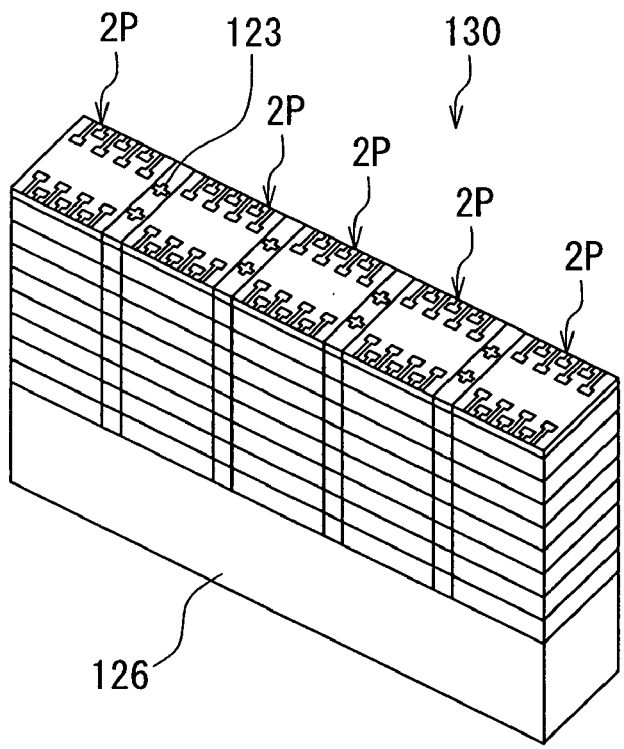
FIG. 33 is a perspective view of an example of the main body aggregate fabricated in the step of FIG. 32.
Figure 34:
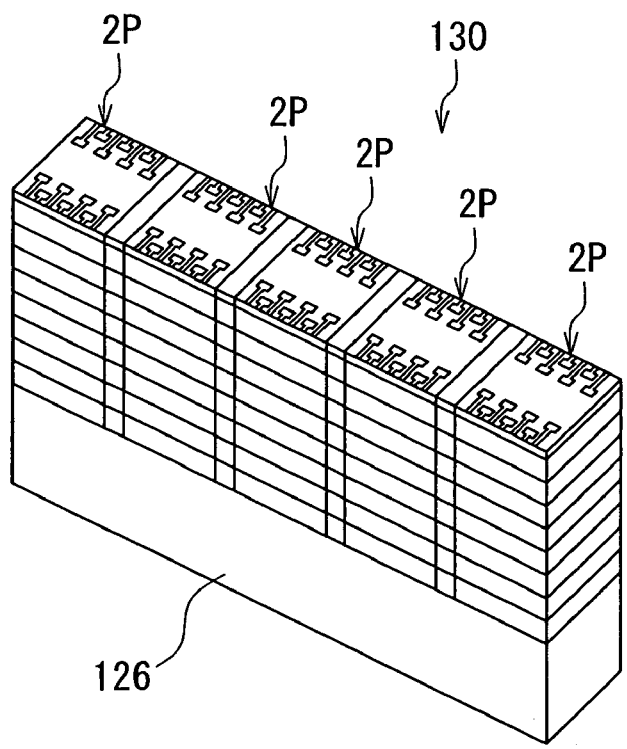
FIG. 34 is a perspective view of another example of the main body aggregate fabricated in the step of FIG. 32.

A description will now be made on the step of fabricating a plurality of layer stacks 2 by using the layered substructure 115. In this step, first, as shown in FIG. 32, the layered substructure 115 is cut with a dicing saw along the first grooves 104A of FIG. 28 to provide a plurality of main body aggregates 130. FIG. 33 shows an example of each main body aggregate 130. FIG. 34 shows another example of each main body aggregate 130. As shown in FIG. 33 and FIG. 34, each main body aggregate 130 includes a plurality of pre-main-body portions 2P that are aligned in one direction that is orthogonal to the stacking direction of the plurality of layer portions 10 of the layer stack 2. Each of the pre-main-body portions 2P will become the layer stack 2 later. The main body aggregate 130 shown in FIG. 33 is obtained by cutting the layered substructure 115 in which the wafer main body 121 of the terminal wafer 120 is transparent and alignment marks 123 are provided on the top surface of the wafer main body 121 at the positions of the boundaries between every adjacent two of the pre-terminal-layer-body portions 21P. The main body aggregate 130 shown in FIG. 34 is obtained by cutting the layered substructure 115 in which the alignment marks 123 are not provided on the top surface of the wafer main body 121. While FIG. 33 and FIG. 34 show that the main body aggregate 130 includes five pre-main-body portions 2P, the main body aggregate 130 can include any plural number of pre-main-body portions 2P.

The layered substructure 115 may be cut in the state of being bonded to a plate-shaped jig or to a wafer sheet that is typically used for dicing a wafer. FIG. 32 shows the example in which the layered substructure 115 has been cut in the state of being bonded to a plate-shaped jig 125. While FIG. 32 shows that the jig 125 is not cut, the jig 125 may be cut together with the layered substructure 115.

As shown in FIG. 33 and FIG. 34, the main body aggregate 130 has a top surface, a bottom surface and four side surfaces. A jig 126 may be bonded to the bottom surface of the main body aggregate 130. The jig 126 may be one obtained by cutting the jig 125 bonded to the layered substructure 115 when cutting the layered substructure 115.

Figure 35:
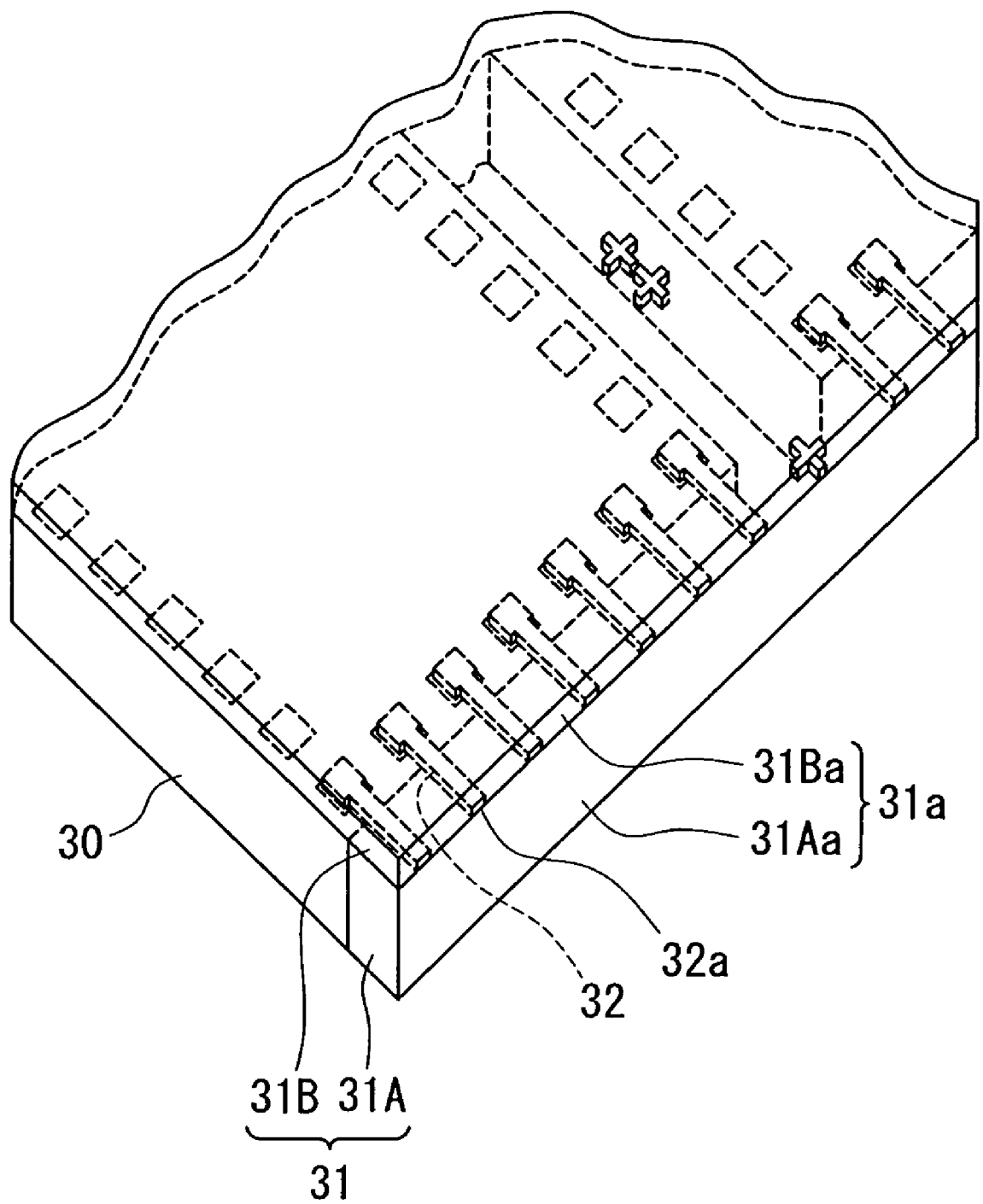
FIG. 35 is a perspective view of a portion of the main body aggregate fabricated in the step of FIG. 32.

In the step of cutting the layered substructure 115, the insulating layer 106 is cut such that a cut surface is formed along the direction in which the first groove 104A of FIG. 28 extends. FIG. 35 shows part of the main body aggregate 130 formed by cutting the layered substructure 115. As shown in FIG. 35, the insulating layer 106 becomes an insulating layer 31A by being cut. The insulating layer 31A is part of the insulating portion 31. In addition, part of the end face 31a of the insulating portion 31 is formed by the cut surface of the insulating layer 106, that is, a cut surface 31Aa of the insulating layer 31A.

In the step of cutting the layered substructure 115, the insulating layer 113 covering the electrodes 32 is also cut when the insulating layer 106 is cut. By being cut, the insulating layer 113 becomes an insulating layer 31B that is another part of the insulating portion 31. In addition, another part of the end face 31a of the insulating portion 31 is formed by the cut surface of the insulating layer 113, that is, a cut surface 31Ba of the insulating layer 31B.

In the step of cutting the layered substructure 115, by cutting the insulating layer 106, the end faces 32a of the plurality of electrodes 32 are exposed from the end face 31a of the insulating portion 31. The end faces 32a are surrounded by the insulating portion 31.

By cutting the layered substructure 115, the end faces 32a of the plurality of electrodes 32 appear at two of the four side surfaces of the main body aggregate 130, the two of the four side surfaces each being parallel to the direction in which the plurality of pre-main-body portions 2P are aligned. To be more specific, the end faces 32Aa of the plurality of electrodes 32A of all the layer portions 10 included in the main body aggregate 130 appear in one of the above two side surfaces of the main body aggregate 130, while the end faces 32Ba of the plurality of electrodes 32B of all the layer portions 10 included in the main body aggregate 130 appear in the other of the two side surfaces of the main body aggregate 130 that is opposite to the one mentioned above.

In the step of fabricating the plurality of layer stacks 2, after cutting the layered substructure 115, polishing is performed on the two side surfaces of the main body aggregate 130 in which the end faces 32a of the electrodes 32 appear.

Next, the main body aggregate 130 is cut so that the plurality of pre-main-body portions 2P included in the main body aggregate 130 are separated into respective layer stacks 2. A plurality of layer stacks 2 are thereby manufactured at a time.

The layer portion 60 is manufactured by cutting the substructure 110 fabricated through the steps shown in FIG. 15 to FIG. 20, along the plurality of grooves 104.

As described so far, in the layered chip package 1 according to the present embodiment, the specific layer portion 60 is interposed between the first portion 71 of the first heat sink 70 and the first portion 81 of the second heat sink 80. The second portion 72 of the first heat sink 70 is adjacent to the respective side surfaces 10f of the plurality of layer portions 10 included in the layer stack 2. The second portion 82 of the second heat sink 80 is adjacent to the side surface 60e of the layer portion 60 and the respective side surfaces 10e of the plurality of layer portions 10 included in the layer stack 2. According to the present embodiment, it is thus possible to improve the heat dissipation effect of the layered chip package 1 without increasing the layered chip package 1 in size. In particular, according to the present embodiment, it is possible to improve the heat dissipation effect of the layer portion 60 including the semiconductor chip 30 that generates a large amount of heat during operation. It is also possible to prevent the heat generated by the semiconductor chip 30 in the layer portion 60 from adversely affecting the operation of the plurality of semiconductor chips 30 in the plurality of layer portions 10 included in the layer stack 2.

Other effects of the layered chip package 1 according to the present embodiment will now be described. According to the present embodiment, the plurality of semiconductor chips 30 included in the layer stack 2 and in the layer portion 60 are electrically connected through the wiring 93A, 93B disposed on the side surfaces of the layer stack 2 and the layer portion 60. Consequently, the present embodiment is free from the problems of the wire bonding method, that is, the problem that it is difficult to reduce the distance between electrodes so as to avoid contact between wires, and the problem that high resistances of the wires hamper a high-speed operation of a circuit.

Compared with the through electrode method, the present embodiment has the following advantages. First, according to the through electrode method, it is impossible to configure the layer portion 60 separately from the layer stack 2 and to interpose a part of the heat sink between the layer portion 60 and the layer stack 2 as in the present embodiment. With the through electrode method, it is therefore impossible to improve the heat dissipation effect of the layer portion 60 including the semiconductor chip 30 that generates a large amount of heat during operation, and it is also impossible to prevent the heat generated by the semiconductor chip 30 in the layer portion 60 from adversely affecting the operation of the plurality of semiconductor chips 30 in the plurality of other layer portions 10. In contrast, according to the present embodiment, it is possible to configure the layer portion 60 separately from the layer stack 2 and to interpose the first portion 71 of the heat sink 70 between the layer portion 60 and the layer stack 2. According to the present embodiment, as previously described, it is thus possible to improve the heat dissipation effect of the layer portion 60 and to prevent the heat generated by the semiconductor chip 30 in the layer portion 60 from adversely affecting the operation of the plurality of semiconductor chips 30 in the plurality of layer portions 10 included in the layer stack 2.

The present embodiment does not require formation of through electrodes in each chip and consequently does not require a large number of steps for forming through electrodes in each chip.

According to the present embodiment, electrical connection between the plurality of semiconductor chips 30 is established through the wiring 93A, 93B disposed on the side surfaces of the layer stack 2 and the layer portion 60. Consequently, compared with the case of using through electrodes to establish electrical connection between chips, the present embodiment allows easy formation of wiring for establishing electrical connection between the semiconductor chips 30 and increases the reliability of the wiring.

Furthermore, according to the present embodiment, it is possible to easily change the line width and thickness of the wiring 93A, 93B. Consequently, it is possible to respond to future demands for finer wiring 93A, 93B.

The through electrode method requires that the through electrodes of upper and lower chips be connected to each other by means of, for example, soldering at high temperatures. In contrast, according to the present embodiment, it is possible to form the wiring 93A, 93B at lower temperatures because the wiring 93A, 93B can be formed by plating, for example. According to the present embodiment, it is also possible to perform bonding of the plurality of layer portions 10 at low temperatures. Consequently, it is possible to prevent the chips 30 from suffering damage from heat.

The through electrode method further requires that upper and lower chips be accurately aligned for connecting the through electrodes of the upper and lower chips to each other. In contrast, according to the present embodiment, electrical connection between the semiconductor chips 30 is performed not at an interface between every vertically adjacent two of the layer portions 10 but through the use of the wiring 93A, 93B disposed on the side surfaces of the layer stack 2. Consequently, the accuracy required for alignment of the plurality of layer portions 10 is lower than that required for alignment of a plurality of chips in the through electrode method.

The manufacturing method for the layer stack 2 of the present embodiment allows a reduction in the number of steps and consequently allows a reduction in cost for the layered chip package 1, compared with the manufacturing method for a layered chip package disclosed in U.S. Pat. No. 5,953,588.

From the foregoing, the present embodiment makes it possible to mass-produce the layered chip package 1 at low cost in a short period of time.

According to the manufacturing method for the layer stack 2 of the present embodiment, it is possible to easily reduce the thicknesses of the plurality of substructures 110 to constitute the layered substructure 115 while preventing damage to the substructures 110. This allows a high-yield manufacture of the layer stack 2 that achieves a reduction in size and a high level of integration.

Second Embodiment

Figure 36:
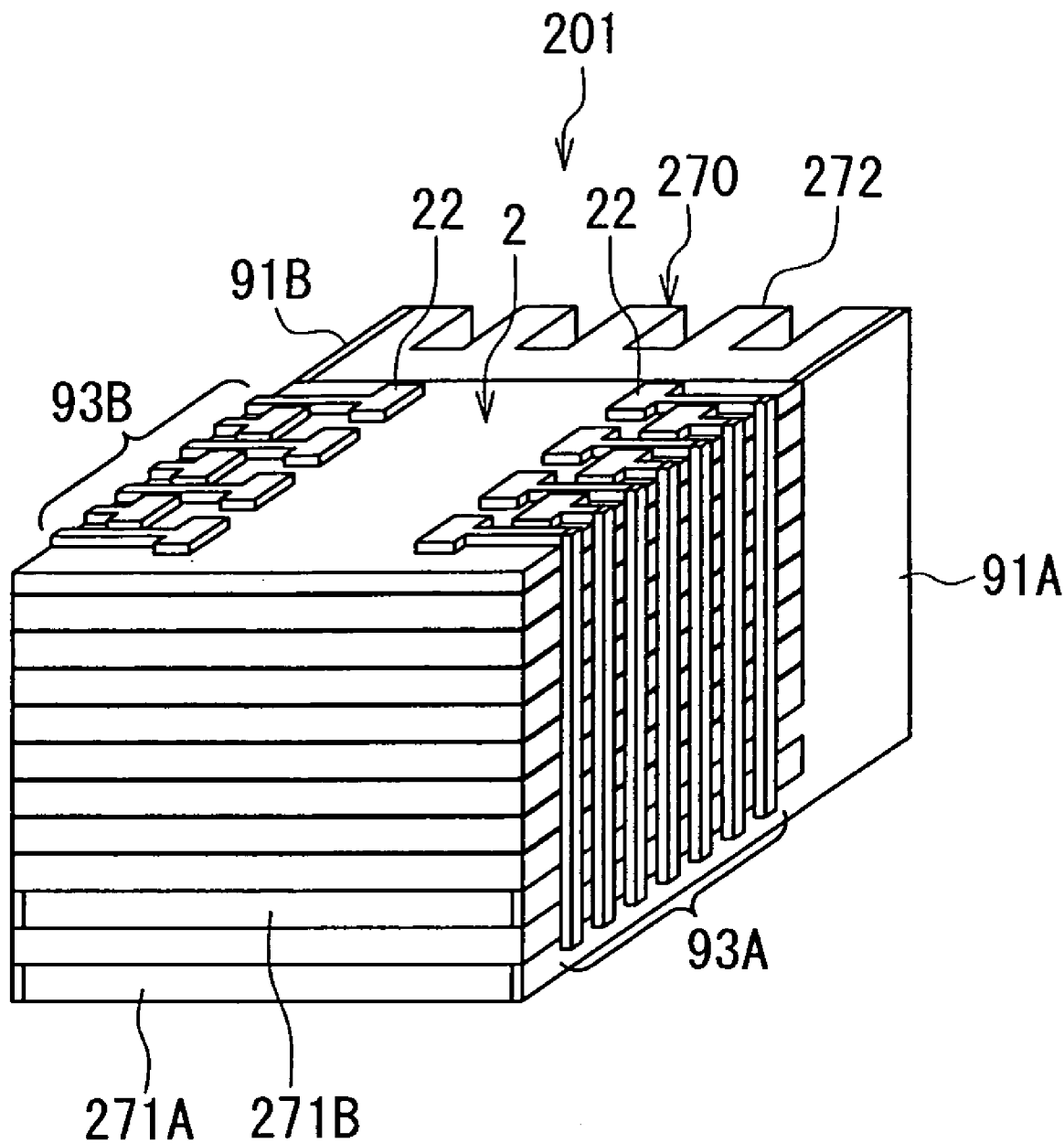
FIG. 36 is a perspective view of a layered chip package according to a second embodiment of the invention.

A second embodiment of the present invention will now be described with reference to FIG. 36. FIG. 36 is a perspective view of a layered chip package 201 according to the present embodiment. The layered chip package 201 according to the present embodiment has a single heat sink 270 instead of the first and second heat sinks 70 and 80 of the first embodiment.

The heat sink 270 has two first portions 271A and 271B disposed at a distance from each other, and a second portion 272 coupled to the two first portions 271A and 271B. In appearance, each of the first portions 271A and 271B has a plate-like configuration with a rectangular planar shape. The first portion 271B is located above the first portion 271A. The second portion 272 is coupled to the first portions 271A and 271B at respective one sides of the first portions 271A and 271B, and extends upward perpendicularly to the first portions 271A and 271B. The second portion 272 is shaped like a fin.

Like the heat sinks 70 and 80 of the first embodiment, the heat sink 270 has a hollow main body and a refrigerant contained in the main body. The main body is formed of metal, for example. The hollow of the second portion 272 communicates with the hollows of the first portions 271A and 271B. The refrigerant fills the entire hollows of the first portions 271A and 271B. It also fills the hollow of the second portion 272 up to an intermediate position of the second portion 272 from the bottom in the vertical direction. The function of the heat sink 270 is the same as that of the heat sinks 70 and 80 of the first embodiment.

In the present embodiment, the specific layer portion 60 is interposed between the two first portions 271A and 271B of the heat sink 270. The first portion 271A is adjacent to the bottom surface 60b of the layer portion 60, while the first portion 271B is adjacent to the top surface 60a of the layer portion 60. The first portion 271B is located between the layer portion 60 and the lowermost layer portion 11 of the layer stack 2. The side surface 60f of the layer portion 60 is adjacent to the second portion 272. The layer portion 60 is bonded to the heat sink 270 by such means as an insulating adhesive. The layer portion 60 and the heat sink 270 are insulated from each other by, for example, this insulating adhesive. With the layer portion 60 and the heat sink 270 bonded together, the side surfaces 60c and 60d of the layer portion 60 slightly protrude from the corresponding side surfaces of the heat sink 270.

The layer stack 2 and the heat sink 270 are arranged so that the first portion 271B of the heat sink 270 is adjacent to the bottom surface 2b of the layer stack 2 and the second portion 272 of the heat sink 270 is adjacent to the side surface 2f of the layer stack 2. The layer stack 2 and the heat sink 270 are bonded by such means as an insulating adhesive. The layer stack 2 and the heat sink 270 are insulated from each other by, for example, this insulating adhesive. With the layer stack 2 and the heat sink 270 bonded together, the upper end of the second portion 272 of the heat sink 270 lies at the same height as or above the top surface 2a of the layer stack 2. With the layer stack 2 and the heat sink 270 bonded together, the side surfaces 2c and 2d of the layer stack 2 slightly protrude from the corresponding side surfaces of the heat sink 270.

In the present embodiment, the insulating film 91A covers the side surface of the heat sink 270 which lies about the side surface 2c of the layer stack 2 and the side surface 60c of the layer portion 60. The wiring 93A is laid astride an area of the side surface of the heat sink 270 lying about the side surfaces 2c and 60c, the area corresponding to the first portion 271B. The insulating film 91A insulates the first portion 271B of the heat sink 270 and the wiring 93A from each other.

The insulating film 91B covers the side surface of the heat sink 270 which lies about the side surface 2d of the layer stack 2 and the side surface 60d of the layer portion 60. The wiring 93B is laid astride an area of the side surface of the heat sink 270 lying about the side surfaces 2d and 60d, the area corresponding to the first portion 271B. The insulating film 91B insulates the first portion 271B of the heat sink 270 and the wiring 93B from each other.

The remainder of configuration, function and effects of the present embodiment are similar to those of the first embodiment.

Third Embodiment

Figure 37:
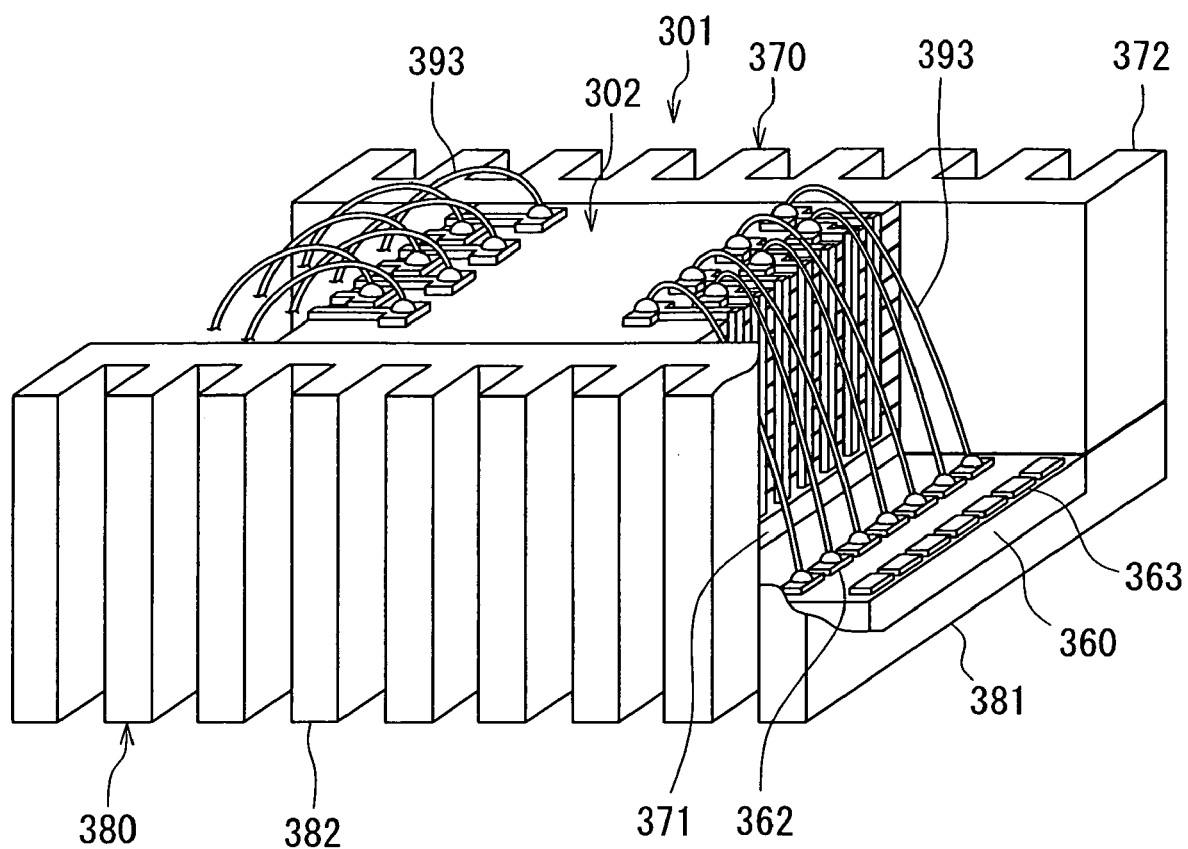
FIG. 37 is a partially cut-away perspective view of a layered chip package according to a third embodiment of the invention.

A third embodiment of the present invention will now be described. Initially, the overall configuration of a layered chip package 301 according to the present embodiment will be described with reference to FIG. 37. FIG. 37 is a partially cut-away perspective view of the layered chip package 301 according to the present embodiment. The layered chip package 301 according to the present embodiment includes a layer stack 302, a specific layer portion 360, a first heat sink 370, and a second heat sink 380. The layer stack 302 includes two or more layer portions that are stacked and integrated. Each of the two or more layer portions included in the layer stack 302 and the layer portion 360 includes a semiconductor chip. The semiconductor chip included in the layer portion 360 is one that generates a large amount of heat during operation, such as a microprocessor. The layered chip package 301 further includes a plurality of bonding wires 393.

Figure 38:
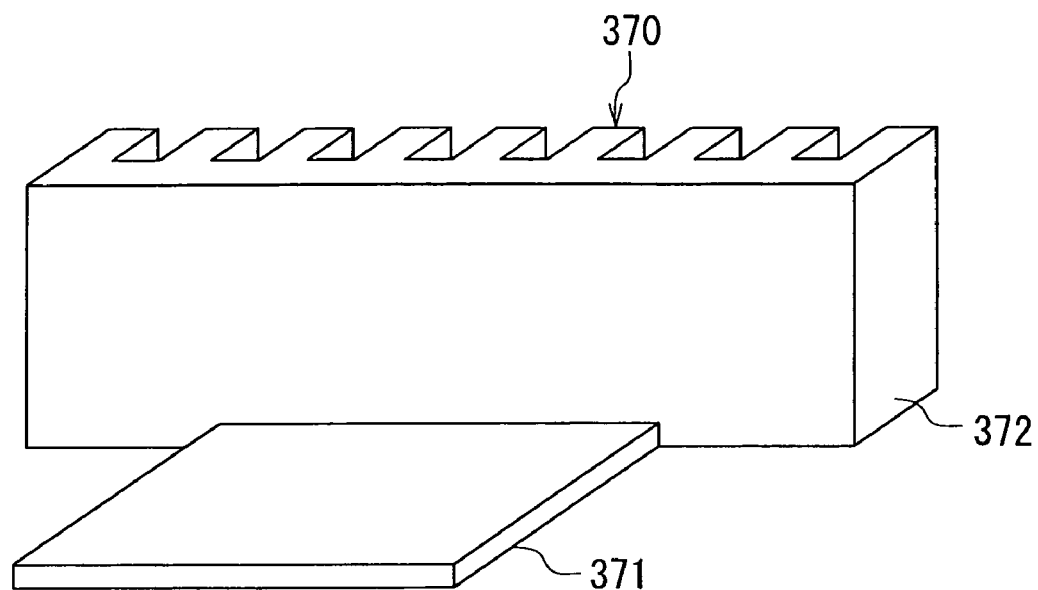
FIG. 38 is a perspective view of a first heat sink of the layered chip package shown in FIG. 37.

FIG. 38 is a perspective view of the first heat sink 370. The first heat sink 370 has a first portion 371 and a second portion 372 coupled to each other. In appearance, the first portion 371 has a plate-like configuration with a rectangular planar shape. The second portion 372 is coupled to the first portion 371 at one side of the first portion 371, and extends upward perpendicularly to the first portion 371. The second portion 372 is shaped like a fin.

Like the first heat sink 70 of the first embodiment, the first heat sink 370 has a hollow main body and a refrigerant contained in the main body. The main body is formed of metal, for example. The hollow of the second portion 372 communicates with the hollow of the first portion 371. The refrigerant fills the entire hollow of the first portion 371. It also fills the hollow of the second portion 372 up to an intermediate position of the second portion 372 from the bottom in the vertical direction. The function of the heat sink 370 is the same as that of the heat sink 70 of the first embodiment.

Figure 39:
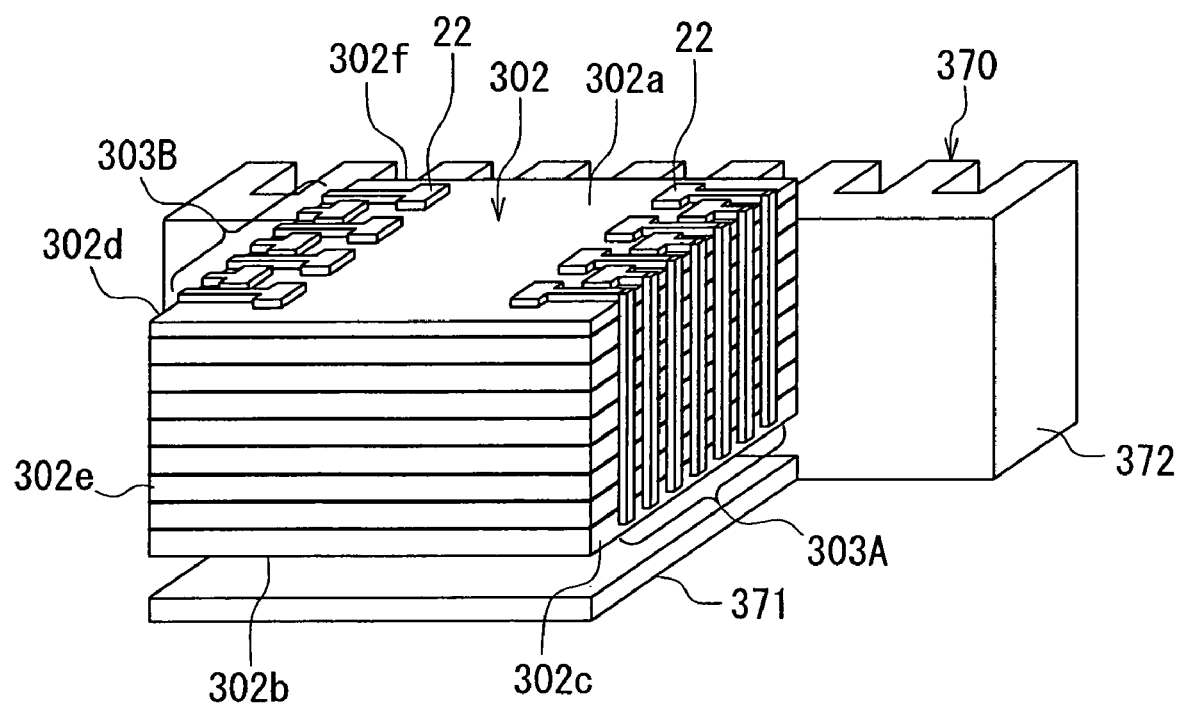
FIG. 39 is a perspective view showing the first heat sink and a layer stack of the layered chip package of FIG. 37 in a separated state.

FIG. 39 is a perspective view showing the first heat sink 370 and the layer stack 302 in a separated state. Like the layer stack 2 of the first embodiment, the layer stack 302 has a top surface 302a, a bottom surface 302b, two side surfaces 302c and 302d facing toward opposite directions, and two side surfaces 302e and 302f facing toward opposite directions. Each of the two or more layer portions included in the layer stack 302 has a top surface, a bottom surface, and four side surfaces. The layer stack 302 has a plurality of pad-shaped terminals 22 disposed on the top surface 302a. The plurality of pad-shaped terminals 22 function as external connecting terminals of the layer stack 302. Some of the plurality of pad-shaped terminals 22 each have an end face located in the side surface 302c, and some others of the plurality of pad-shaped terminals 22 each have an end face located in the side surface 302d. The layer stack 302 excluding the plurality of pad-shaped terminals 22 is rectangular-solid-shaped.

The layer portions included in the layer stack 302 have the same configuration as that of the layer portions 10 of the first embodiment. Consequently, end faces of a plurality of electrodes are located in two of the side surfaces of each layer portion, the two of the side surfaces being located in the side surfaces 302c and 302d of the layer stack 302, respectively.

The layer stack 302 and the first heat sink 370 are arranged so that the first portion 371 of the first heat sink 370 is adjacent to the bottom surface 302b of the layer stack 302 and the second portion 372 of the first heat sink 370 is adjacent to the side surface 302f of the layer stack 302. The layer stack 302 and the first heat sink 370 are bonded by such means as an insulating adhesive. The layer stack 302 and the first heat sink 370 are insulated from each other by, for example, this insulating adhesive. With the layer stack 302 and the first heat sink 370 bonded together, the upper end of the second portion 372 of the first heat sink 370 lies at the same height as or above the top surface 302a of the layer stack 302.

The layered chip package 301 according to the present embodiment further includes wiring 303A disposed on the side surface 302c of the layer stack 302, and wiring 303B disposed on the side surface 302d of the layer stack 302. The wiring 303A is connected to the end faces of the plurality of pad-shaped terminals 22 located in the side surface 302c of the layer stack 302, and to the end faces of the plurality of electrodes located in one of the side surfaces of each of the layer portions, the one of the side surfaces being located in the side surface 302c of the layer stack 302. The wiring 303B is connected to the end faces of the plurality of pad-shaped terminals 22 located in the side surface 302d of the layer stack 302, and to the end faces of the plurality of electrodes located in one of the side surfaces of each of the layer portions, the one of the side surfaces being located in the side surface 302d of the layer stack 302.

Figure 40:
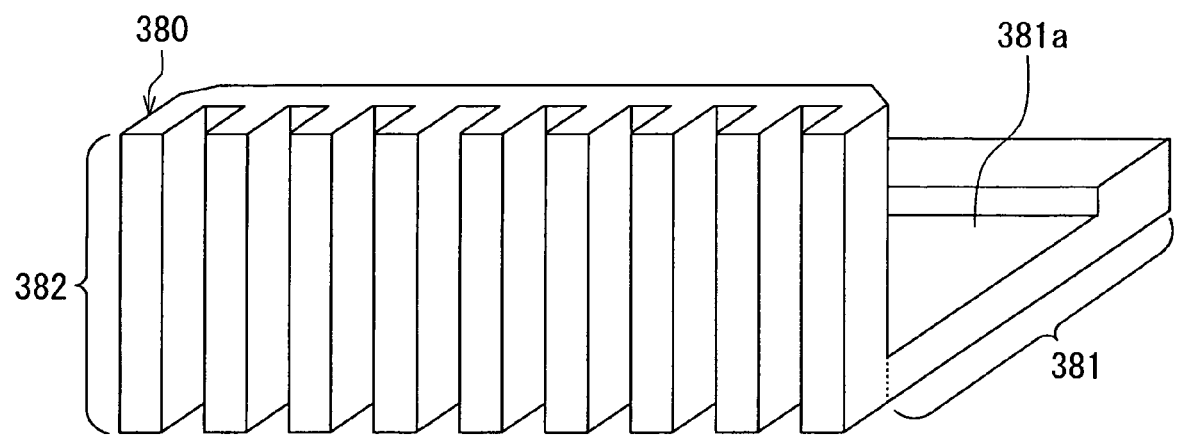
FIG. 40 is a perspective view of a second heat sink of the layered chip package shown in FIG. 37.
Figure 41:
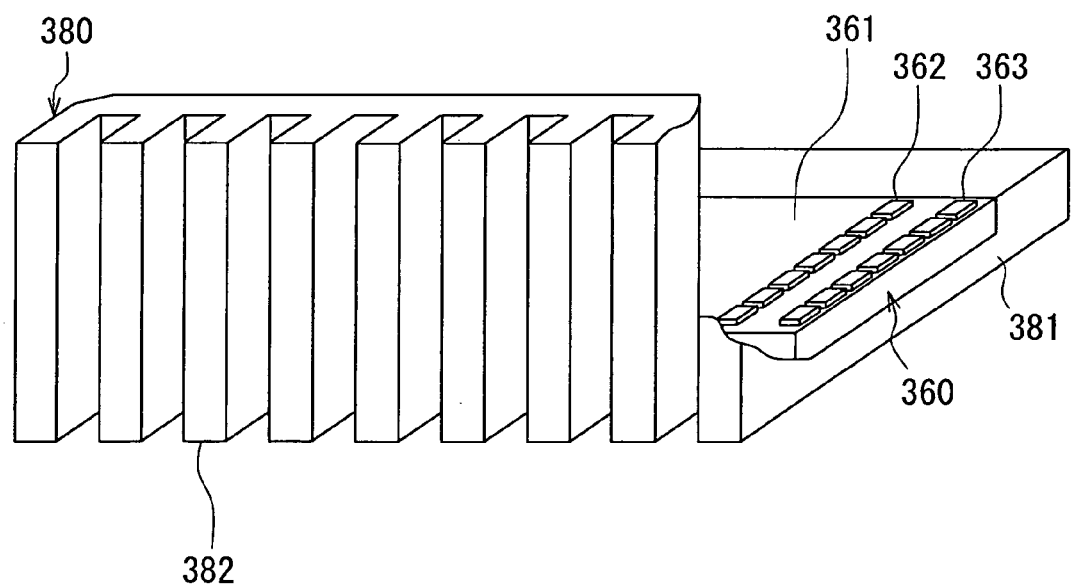
FIG. 41 is a perspective view showing the second heat sink and a specific layer portion of the layered chip package of FIG. 37 in a bonded state.

FIG. 40 is a perspective view of the second heat sink 380. FIG. 41 is a perspective view showing the second heat sink 380 and the layer portion 360 in a bonded state. Note that FIG. 41 provides a partially cut-away view of the second heat sink 380. The layer portion 360 has a top surface, a bottom surface, and four side surfaces. The layer portion 360 has a plurality of pad-shaped terminals 362 and a plurality of pad-shaped terminals 363 both disposed on the top surface. Some of the plurality of pad-shaped terminals 362 and some of the plurality of pad-shaped terminals 363 are connected to the semiconductor chip included in the layer portion 360. Some others of the plurality of pad-shaped terminals 363 are connected to some others of the plurality of pad-shaped terminals 362. The plurality of pad-shaped terminals 363 function as external connecting terminals of the layered chip package 301.

As shown in FIG. 40, the second heat sink 380 has a first portion 381 and a second portion 382 coupled to each other. In appearance, the first portion 381 has a plate-like configuration with a rectangular planar shape. A recess 381a is formed in the top surface of the first portion 381. As shown in FIG. 41, the layer portion 360 is accommodated in the recess 381a. The layer portion 360 is bonded to the second heat sink 380 by such means as an insulating adhesive. The layer portion 360 and the second heat sink 380 are insulated from each other by, for example, this insulating adhesive. With the layer portion 360 and the second heat sink 380 bonded together, the top surface of the layer portion 360 excluding the plurality of pad-shaped terminals 362 and 363 is flush with the top surface of the first portion 381 excluding the recess 381a.

The second portion 382 is coupled to the first portion 381 at one side of the first portion 381, and extends upward perpendicularly to the first portion 381. The second portion 382 is shaped like a fin. One of the side surfaces of the layer portion 360 is adjacent to the second portion 382.

Like the second heat sink 80 of the first embodiment, the second heat sink 380 has a hollow main body and a refrigerant contained in the main body. The main body is formed of metal, for example. The hollow of the second portion 382 communicates with the hollow of the first portion 381. The refrigerant fills the entire hollow of the first portion 381. It also fills the hollow of the second portion 382 up to an intermediate position of the second portion 382 from the bottom in the vertical direction. The function of the heat sink 380 is the same as that of the heat sink 80 of the first embodiment.

As shown in FIG. 37, the plurality of bonding wires 393 are connected to the plurality of pad-shaped terminals 22 of the layer stack 302 at respective one ends thereof. The respective other ends of the plurality of bonding wires 393 are connected to the plurality of pad-shaped terminals 362 of the layer portion 360. In the present embodiment, the plurality of bonding wires 393 thus electrically connect the layer portion 360 to the other one or more layer portions, i.e., the one or more layer portions 10 included in the layer stack 302.

A method of manufacturing the layered chip package 301 will now be described. In the method of manufacturing the layered chip package 301, first, the layer stack 302 and the first heat sink 370 are bonded to each other into a first combination, while the layer portion 360 and the second heat sink 380 are bonded to each other into a second combination. Next, as shown in FIG. 37, the first combination and the second combination are bonded to each other by such means as an adhesive such that the first portion 371 of the first heat sink 370 is placed on the layer portion 360 while the second portion 382 of the second heat sink 380 is adjacent to the side surface 302e of the layer stack 302. Next, the plurality of bonding wires 393 are formed. The layered chip package 301 is thus completed.

Figure 42:
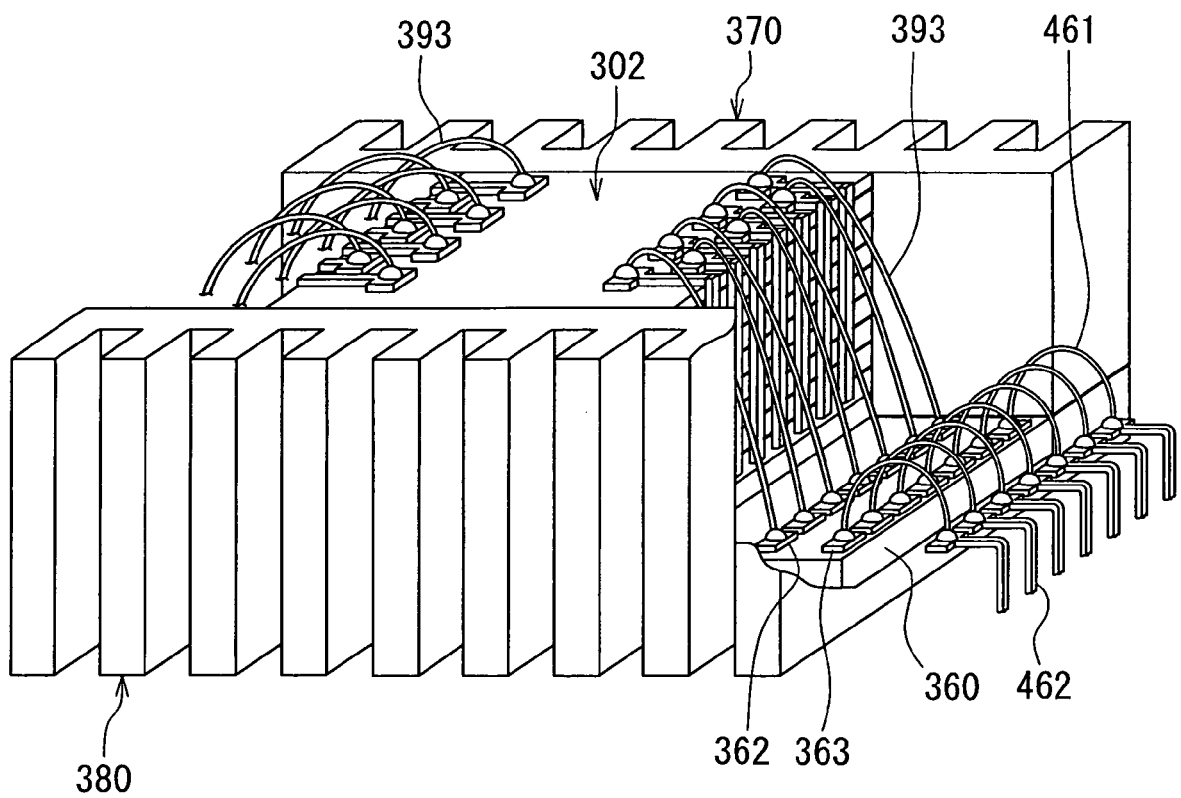
FIG. 42 is a perspective view showing an example of use of the layered chip package shown in FIG. 37.

FIG. 42 shows an example of use of the layered chip package 301. In this example, a plurality of bonding wires 461 are connected to the plurality of pad-shaped terminals 363 at respective one ends thereof The respective other ends of the plurality of bonding wires 461 are connected to a plurality of terminals 462 of a device for use with the layered chip package 301.

Figure 43:
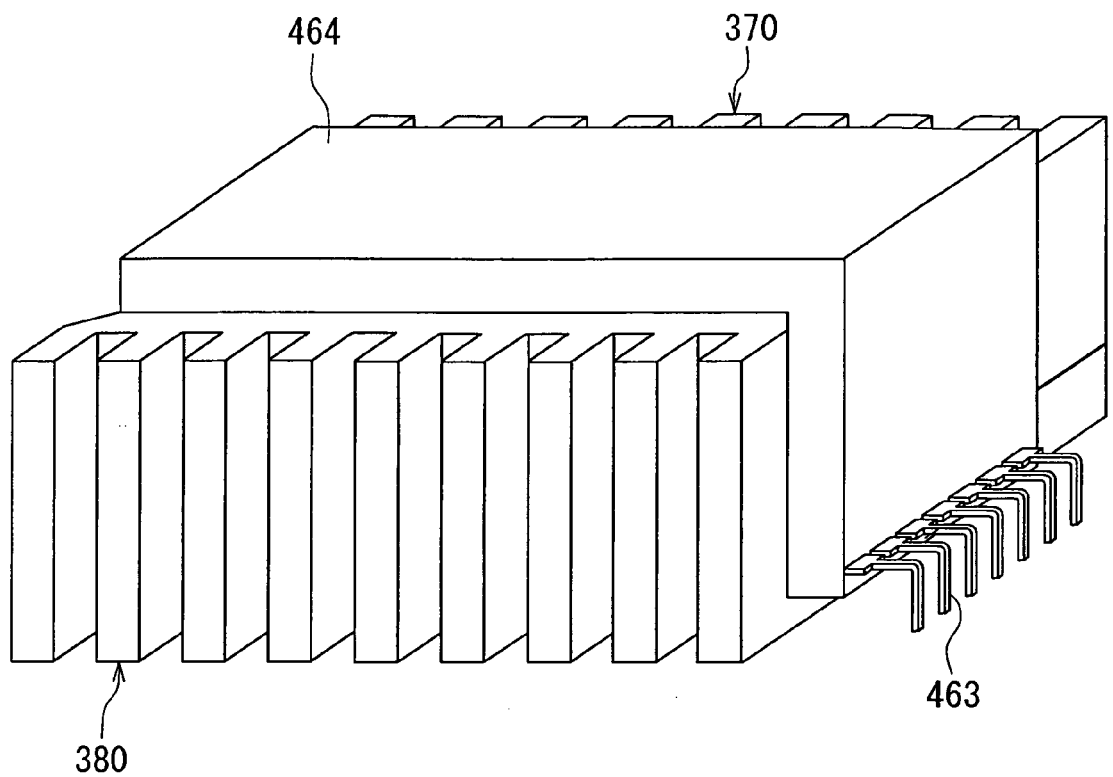
FIG. 43 is a perspective view showing an example of use of the layered chip package shown in FIG. 37.

FIG. 43 shows another example of use of the layered chip package 301. In this example, the layered chip package 301 is mounted to a lead frame having a plurality of pins 463 and is sealed with a molded resin. The plurality of pad-shaped terminals 363 of the layered chip package 301 are connected to the plurality of pins 463. The molded resin forms a protection layer 464 for protecting the layered chip package 301.

Next, an example of a method of forming the wiring 303A, 303B on the layer stack 302 will be described with reference to FIG. 44 to FIG. 48. In this example, the wiring 303A, 303B is formed for each of the pre-main-body portions 2P of the main body aggregate 130 shown in FIG. 32 to FIG. 34. The pre-main-body portions 2P in this example are the portions to become the layer stacks 302 later. In the step of forming the wiring 303A, 303B, a plurality of main body aggregates 130 may be arranged in the stacking direction of the plurality of layer portions 10 and then the wiring 303A, 303B may be formed for the pre-main-body portions 2P of the plurality of main body aggregates 130 at a time. This makes it possible to form the wiring 303A, 303B for a large number of pre-main-body portions 2P in a short period of time.

Figure 44:
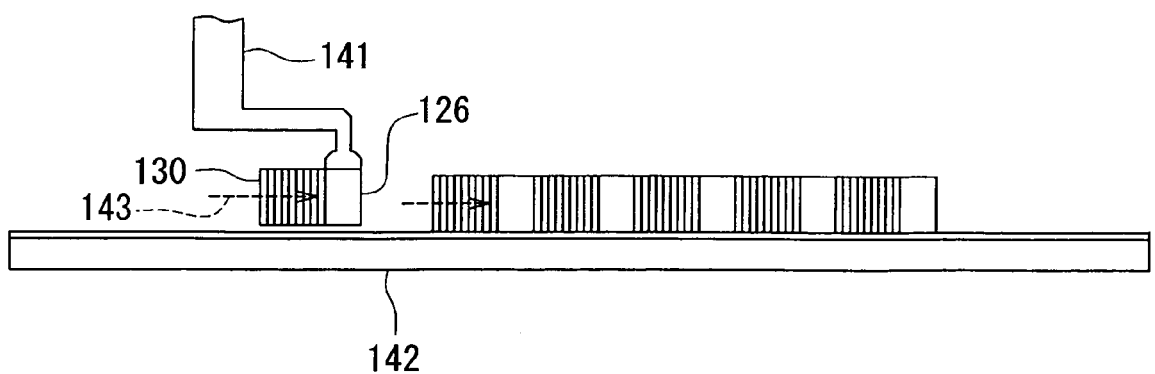
FIG. 44 is an illustrative view showing an example of a method of arranging a plurality of main body aggregates in the manufacturing method for the layer stack of the third embodiment of the invention.
Figure 45:
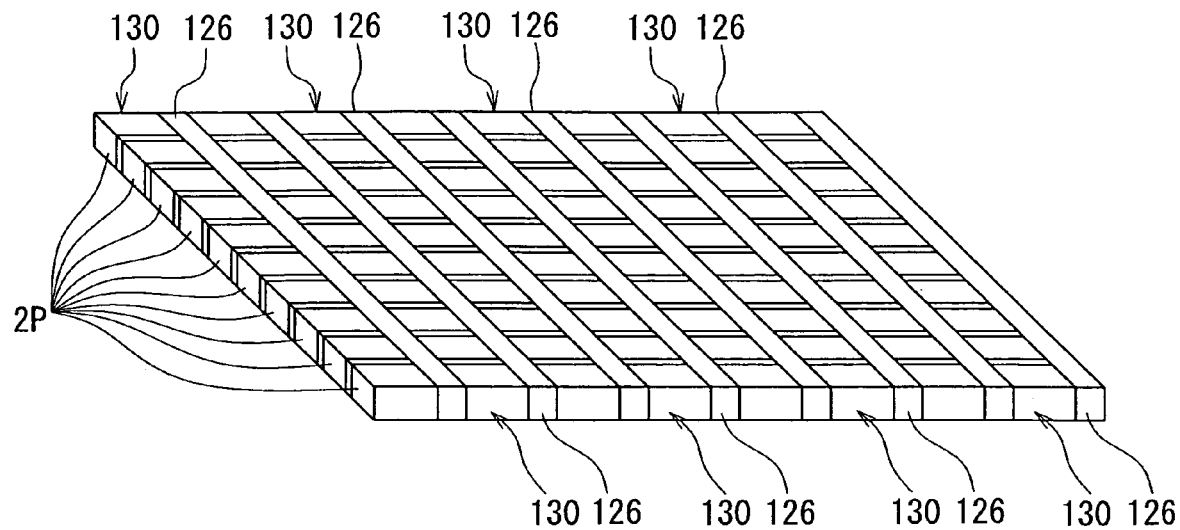
FIG. 45 is a perspective view showing a state in which a plurality of main body aggregates are arranged with a jig bonded to each of the main body aggregates.

FIG. 44 shows an example of a method of arranging a plurality of main body aggregates 130. In this example, a plurality of main body aggregates 130 each of which has the jig 126 bonded thereto are arranged on a table 142, while performing alignment, in the stacking direction of the plurality of layer portions 10 by using a chip bonding apparatus capable of recognizing and controlling the position of a chip. Reference numeral 141 in FIG. 44 indicates a head for holding a chip. In this example, each main body aggregate 130 with the jig 126 bonded thereto is held by the head 141 and placed to a desired position on the table 142 while recognizing and controlling the position of the main body aggregate 130. FIG. 45 shows a state in which a plurality of main body aggregates 130 each of which has the jig 126 bonded thereto are arranged in the stacking direction of the plurality of layer portions 10. The plurality of main body aggregates 130 thus arranged may be fixed by being bonded to each other such that they are easily separable.

When arranging the plurality of main body aggregates 130, the position of the edge of each main body aggregate 130 and/or the positions of the end faces 32a of the electrodes 32 that appear at the side surfaces of each main body aggregate 130 may be recognized with an image recognizer included in the chip bonding apparatus. It is thereby possible to recognize and control the position of each main body aggregate 130.

Figure 46:
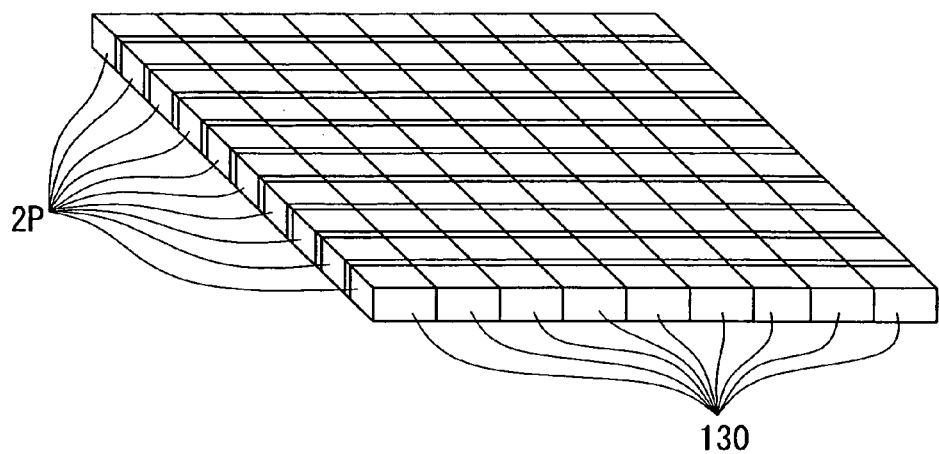
FIG. 46 is a perspective view showing a state in which a plurality of main body aggregates are arranged without any jig bonded to each of the main body aggregates.

Alternatively, a plurality of main body aggregates 130 each without the jig 126 bonded thereto may be arranged in the stacking direction of the plurality of layer portions 10 while performing alignment. FIG. 46 shows the plurality of main body aggregates 130 arranged in such a manner. In this case, too, the plurality of main body aggregates 130 thus arranged may be fixed by being bonded to each other such that they are easily separable.

In the case of arranging a plurality of main body aggregates 130 each without the jig 126 bonded thereto, if the portions to become the insulating portion 31 and the terminal layer main body 21 are transparent and consequently at least either the alignment marks 107 or 123 are observable, the position of each main body aggregate 130 may be recognized and controlled by recognizing at least either the alignment marks 107 or 123 through the use of the image recognizer included in the chip bonding apparatus. In this case, the alignment marks are observed in the direction of the arrow 143 in FIG. 44.

Figure 47:
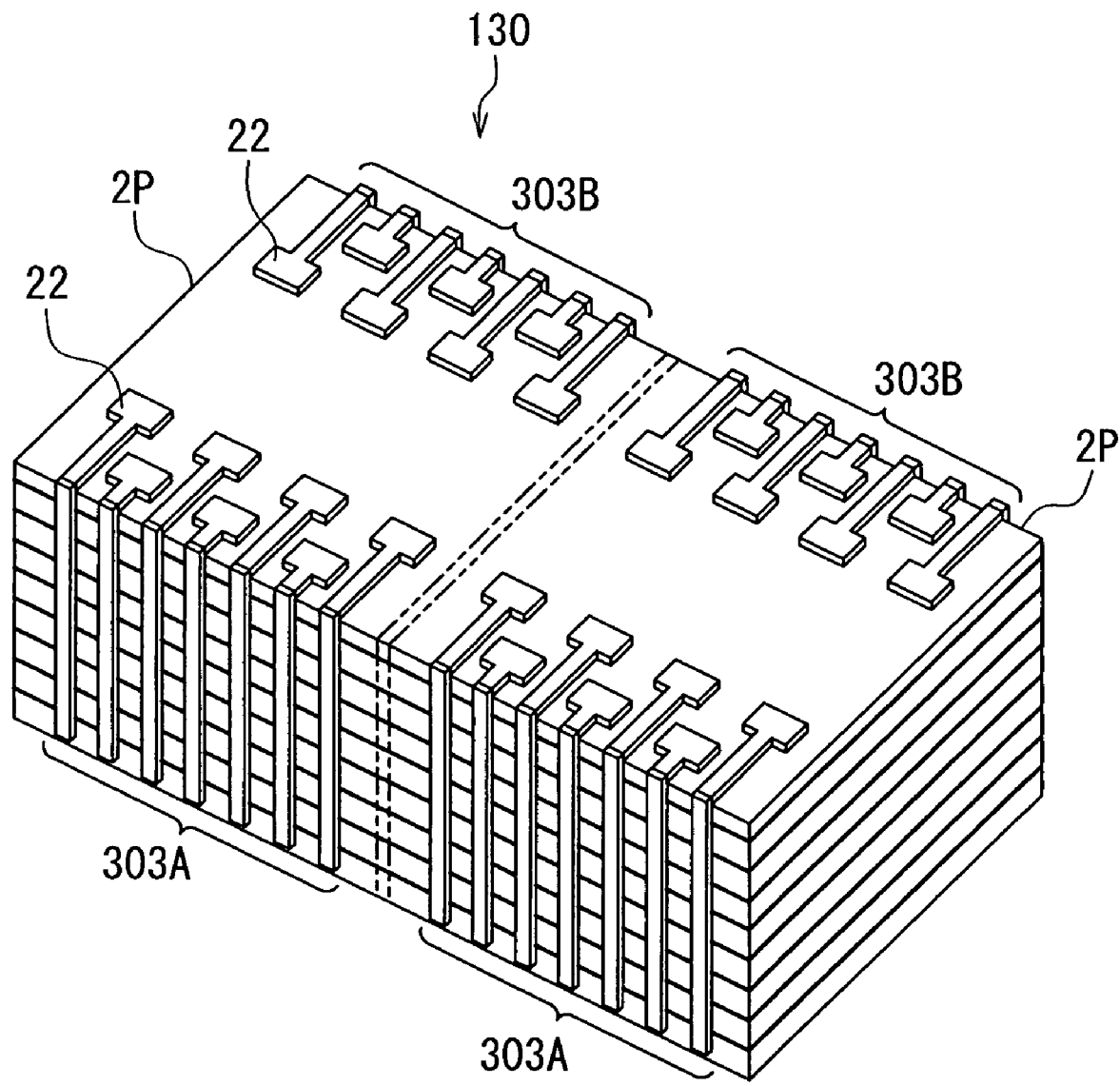
FIG. 47 is a perspective view of a portion of the main body aggregate having undergone the formation of wiring.

Reference is now made to FIG. 47 to describe the step of forming the wiring 303A, 303B. In this step, the wiring 303A, 303B is formed for each of the pre-main-body portions 2P of the main body aggregate 130. The wiring 303A, 303B is formed by frame plating, for example. In this case, first, a seed layer for plating is formed on the side surface of the main body aggregate 130 on which the wiring 303A is to be formed. Next, a frame having grooves is formed on the seed layer. The frame is formed by patterning a photoresist film by photolithography, for example. Next, plating layers to become part of the wiring 303A is formed by plating on the seed layer in the grooves of the frame. Next, the frame is removed and the seed layer except portions thereof located below the plating layers is also removed by etching. As a result, the wiring 303A is formed of the plating layers and the portions of the seed layer remaining therebelow. Next, the wiring 303B is formed by the same forming method as the wiring 303A on the side surface of the main body aggregate 130 on which the wiring 303B is to be formed. FIG. 47 shows a portion of the main body aggregate 130 having undergone the formation of the wiring 303A, 303B.

Figure 48:
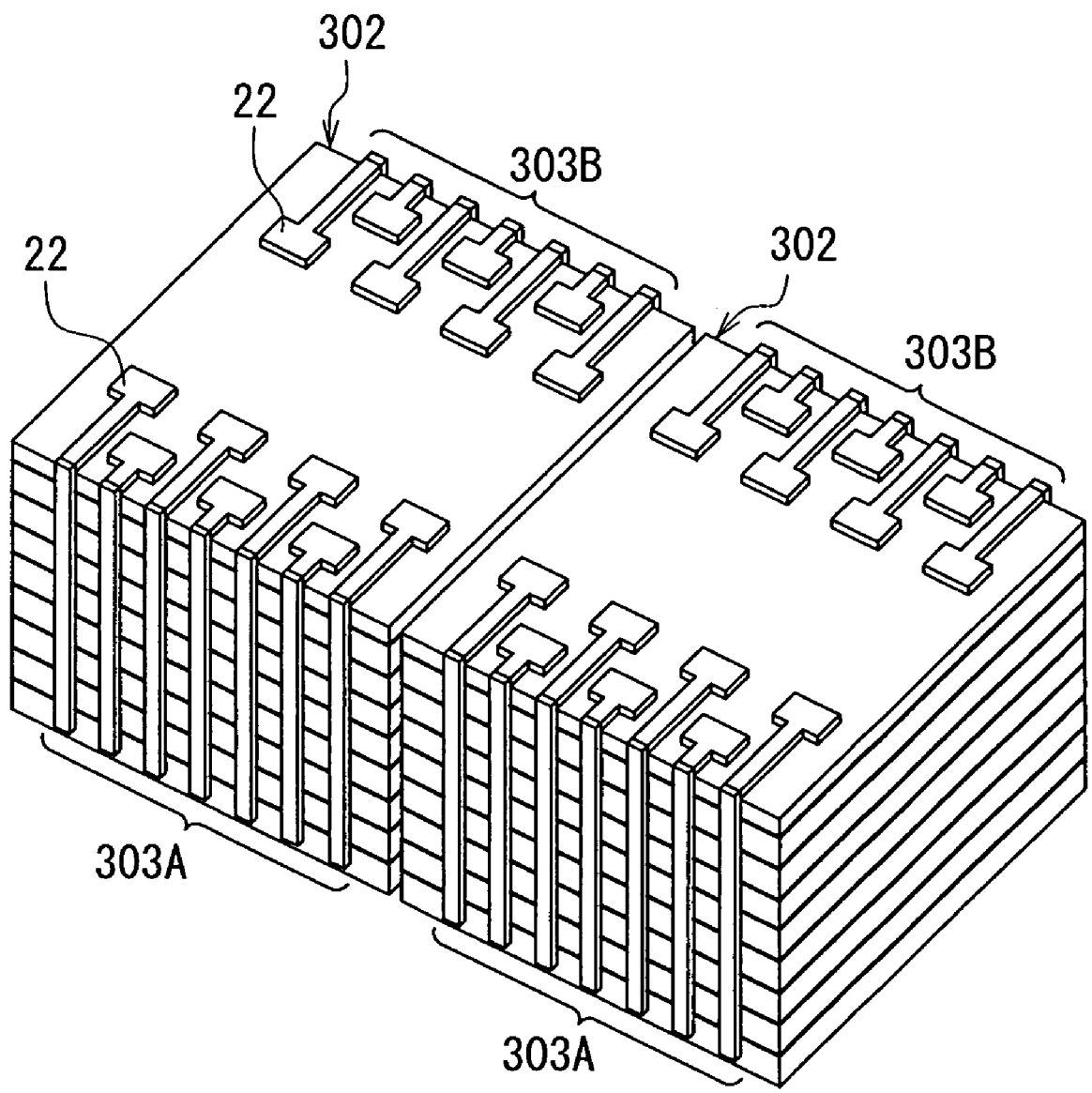
FIG. 48 is a perspective view showing a plurality of layer stacks formed by cutting the main body aggregate.

Reference is now made to FIG. 48 to describe the step of cutting the main body aggregate 130. In this step, the main body aggregate 130 is cut so that the plurality of pre-main-body portions 2P included in the main body aggregate 130 are separated from each other into the layer stacks 302. In this way, a plurality of layer stacks 302 having the wiring 303A, 303B formed thereon are manufactured at a time.

In the present embodiment, the layer stack 302 and the layer portion 360 are electrically connected to each other by the plurality of bonding wires 393. The electrical connection between the plurality of semiconductor chips included in the layer stack 302 of the present embodiment may be established by means of through electrodes instead of the wiring 303A, 303B.

The remainder of configuration, function, and effects of the present embodiment are similar to those of the first embodiment except in regard to the wiring 93A, 93B of the first embodiment.

The present invention is not limited to the foregoing embodiments but can be carried out in various modifications. For example, in the first embodiment, the second portion 72 of the heat sink 70 and the second portion 82 of the heat sink 80 may be arranged so that they are adjacent to two mutually orthogonal side surfaces of each of the plurality of layer portions 10 and 60. In this case, the wiring is disposed on at least one of the four side surfaces of each of the plurality of layer portions 10 and 60 to which neither of the second portions 72 and 82 of the heat sinks 70 and 80 is adjacent.

In addition, in the first and second embodiments, the layer stack 2 may be without the terminal layer 20, and part of the wiring 93A, 93B may also function as external connecting terminals.

It is apparent that the present invention can be carried out in various forms and modifications in the light of the foregoing descriptions. Accordingly, within the scope of the following claims and equivalents thereof, the present invention can be carried out in forms other than the foregoing most preferred embodiments.

What is claimed is:

1. A layered chip package comprising a plurality of layer portions stacked, each of the plurality of layer portions including a semiconductor chip, the layered chip package further comprising a heat sink and wiring, wherein:
   each of the plurality of layer portions has a top surface, a bottom surface, and four side surfaces;
   the heat sink has at least one first portion, and a second portion coupled to the at least one first portion;
   the at least one first portion is adjacent to the top surface or the bottom surface of at least one of the layer portions;
   the second portion is in contact with one of the side surfaces of each of at least two of the plurality of layer portions;
   any two or more layer portions among the plurality of layer portions are each configured to further include a plurality of electrodes, each of the electrodes being connected to the semiconductor chip and having an end face located in at least one of the four side surfaces of the layer portion that the second portion of the heat sink is not in contact with; and
   the wiring is connected to the end faces of the plurality of electrodes of the two or more layer portions.

2. The layered chip package according to claim 1, further comprising a layer stack including two or more of the layer portions that are integrated.

3. The layered chip package according to claim 2, wherein each of the two or more of the layer portions included in the layer stack further includes the plurality of electrodes.

4. The layered chip package according to claim 3, wherein:
each semiconductor chip has a top surface, a bottom surface, and four side surfaces;
each of the two or more of the layer portions included in the layer stack further includes an insulating portion covering at least one of the four side surfaces of the semiconductor chip;
the insulating portion has at least one end face located in at least one of the four side surfaces of the layer portion that the second portion of the heat sink is not in contact with; and
the end face of each of the plurality of electrodes is surrounded by the insulating portion.

5. The layered chip package according to claim 1, wherein:
the at least one first portion of the heat sink comprises two first portions located at a distance from each other; and
a specific one of the plurality of layer portions is interposed between the two first portions.

6. The layered chip package according to claim 5, wherein each of the plurality of layer portions further includes the plurality of electrodes.

7. The layered chip package according to claim 6, wherein:
each semiconductor chip has a top surface, a bottom surface, and four side surfaces;
each of the plurality of layer portions further includes an insulating portion covering at least one of the four side surfaces of the semiconductor chip;
the insulating portion has at least one end face located in at least one of the four side surfaces of the layer portion that the second portion of the heat sink is not in contact with; and
the end face of each of the plurality of electrodes is surrounded by the insulating portion.

8. The layered chip package according to claim 6, wherein:
one of the two first portions of the heat sink is located between the specific one of the layer portions and a different one of the layer portions; and
the layered chip package further comprises an insulating film disposed between the wiring and the one of the first portions that is located between the specific one of the layer portions and the different one of the layer portions.

9. The layered chip package according to claim 1, wherein the heat sink has a hollow main body, and a refrigerant contained in the main body.

10. A layered chip package
comprising a plurality of layer portions stacked, each of the plurality of layer portions including a semiconductor chip, the layered chip package further comprising a first heat sink, a second heat sink, and wiring, wherein:
each of the plurality of layer portions has a top surface, a bottom surface, and four side surfaces;
each of the first and second heat sinks has a first portion and a second portion coupled to each other;
a specific one of the plurality of layer portions is interposed between the first portion of the first heat sink and the first portion of the second heat sink;
at least one of the second portion of the first heat sink and the second portion of the second heat sink is in contact with one of the side surfaces of each of at least two of the plurality of layer portions;
any two or more layer portions among the plurality of layer portions are each configured to further include a plurality of electrodes, each of the electrodes being connected to the semiconductor chip and having an end face located in at least one of the four side surfaces of the layer portion that neither the second portion of the first heat sink nor the second portion of the second heat sink is in contact with; and
the wiring is connected to the end faces of the plurality of electrodes of the two or more layer portions.

11. The layered chip package according to claim 10, further comprising a layer stack including two or more of the layer portions that are integrated, wherein:
the layer stack has a top surface, a bottom surface, and a first to a fourth side surface;
the first portion of the first heat sink is adjacent to the top surface of the specific one of the layer portions;
the second portion of the first heat sink is in contact with the first side surface of the layer stack;
the first portion of the second heat sink is adjacent to the bottom surface of the specific one of the layer portions; and
the second portion of the second heat sink is in contact with one of the side surfaces of the specific one of the layer portions and with the second side surface of the layer stack.

12. The layered chip package according to claim 11, wherein each of the two or more of the layer portions included in the layer stack further includes the plurality of electrodes.

13. The layered chip package according to claim 12, wherein:
each semiconductor chip has a top surface, a bottom surface, and four side surfaces;
each of the two or more of the layer portions included in the layer stack further includes an insulating portion covering at least one of the four side surfaces of the semiconductor chip;
the insulating portion has at least one end face located in at least one of the four side surfaces of the layer portion that neither the second portion of the first heat sink nor the second portion of the second heat sink is in contact with; and
the end face of each of the plurality of electrodes is surrounded by the insulating portion.

14. The layered chip package according to claim 10, wherein each of the plurality of layer portions further includes the plurality of electrodes.

15. The layered chip package according to claim 14, wherein:
each semiconductor chip has a top surface, a bottom surface, and four side surfaces;
each of the plurality of layer portions further includes an insulating portion covering at least one of the four side surfaces of the semiconductor chip;
the insulating portion has at least one end face located in at least one of the four side surfaces of the layer portion that neither the second portion of the first heat sink nor the second portion of the second heat sink is in contact with; and
the end face of each of the plurality of electrodes is surrounded by the insulating portion.

16. The layered chip package according to claim 14, wherein:
the first portion of the first heat sink or the first portion of the second heat sink is located between the specific one of the layer portions and a different one of the layer portions; and
the layered chip package further comprises an insulating film for insulation between the wiring and the first portion located between the specific one of the layer portions and the different one of the layer portions.

17. The layered chip package according to claim 10, further comprising a plurality of bonding wires for establishing electrical connection between the specific one of the layer portions and other one or more of the layer portions.

18. The layered chip package according to claim 10, wherein each of the first and second heat sinks has a hollow main body, and a refrigerant contained in the main body.

* * * * *